(12) United States Patent
Thomson et al.

(10) Patent No.: US 11,791,331 B2
(45) Date of Patent: Oct. 17, 2023

(54) INTEGRATED CIRCUIT STRUCTURES INCLUDING BACKSIDE VIAS

(71) Applicant: Intel Corporation, Santa Clara, CA (US)

(72) Inventors: Nicholas A. Thomson, Hillsboro, OR (US); Kalyan C. Kolluru, Portland, OR (US); Adam Clay Faust, Portland, OR (US); Frank Patrick O'Mahony, Portland, OR (US); Ayan Kar, Portland, OR (US); Rui Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 17/526,199

(22) Filed: Nov. 15, 2021

(65) Prior Publication Data

US 2022/0077140 A1  Mar. 10, 2022

Related U.S. Application Data

(62) Division of application No. 16/728,111, filed on Dec. 27, 2019, now abandoned.

(51) Int. Cl.
*H01L 27/02* (2006.01)

(52) U.S. Cl.
CPC ...... *H01L 27/0292* (2013.01); *H01L 27/0255* (2013.01); *H01L 27/0288* (2013.01)

(58) Field of Classification Search
CPC . H01L 25/115; H01L 25/0753; H01L 25/072; H01L 25/0655; H01L 25/042;
(Continued)

(56) References Cited

U.S. PATENT DOCUMENTS 8,803,206 B1 * 8/2014 Or-Bach ............... H01L 23/34
257/355
9,165,793 B1 * 10/2015 Wang ............... H01L 23/49827
(Continued)

FOREIGN PATENT DOCUMENTS

DE   102020127728 A1   7/2021

OTHER PUBLICATIONS

Final Office Action in U.S. Appl. No. 16/728,111 dated Oct. 15, 2021, 16 pages.
(Continued)

*Primary Examiner* — Jarrett J Stark
(74) *Attorney, Agent, or Firm* — Akona IP

(57) ABSTRACT

Disclosed herein are integrated circuit (IC) structures including backside vias, as well as related methods and devices. In some embodiments, an IC structure may include: a device layer, wherein the device layer includes a plurality of active devices; a first metallization layer over the device layer, wherein the first metallization layer includes a first conductive pathway in conductive contact with at least one of the active devices in the device layer; a second metallization layer under the device layer, wherein the second metallization layer includes a second conductive pathway; and a conductive via in the device layer, wherein the conductive via is in conductive contact with at least one of the active devices in the device layer and also in conductive contact with the second conductive pathway.

16 Claims, 16 Drawing Sheets

(58) Field of Classification Search
CPC .............. H01L 27/0292; H01L 27/0255; H01L 27/0288; H01L 2224/02

See application file for complete search history.

(56) References Cited

U.S. PATENT DOCUMENTS

| | | | | |
|---|---|---|---|---|
| 9,385,140 | B1* | 7/2016 | McMullan | H01L 21/32055 |
| 9,640,531 | B1* | 5/2017 | Or-Bach | H01L 27/1203 |
| 10,373,921 | B2* | 8/2019 | Matsubara | H02M 7/003 |
| 10,607,938 | B1* | 3/2020 | Rubin | H01L 21/823475 |
| 10,727,236 | B2* | 7/2020 | Wu | H01L 27/0207 |
| 11,462,282 | B2* | 10/2022 | Su | G11C 17/18 |
| 2012/0056312 | A1* | 3/2012 | Pagaila | H01L 23/3128 |
| | | | | 257/E23.116 |
| 2014/0091473 | A1* | 4/2014 | Len | H01L 21/4853 |
| | | | | 438/118 |
| 2015/0070247 | A1 | 3/2015 | Kasahara | |
| 2015/0084194 | A1* | 3/2015 | Molzer | H01L 23/481 |
| | | | | 257/774 |
| 2015/0270247 | A1* | 9/2015 | Chen | H01L 25/105 |
| | | | | 257/737 |
| 2015/0303174 | A1* | 10/2015 | Yu | H01L 24/20 |
| | | | | 438/109 |
| 2015/0311142 | A1* | 10/2015 | Sekar | H01L 23/481 |
| | | | | 257/499 |
| 2016/0071818 | A1* | 3/2016 | Wang | H01L 24/49 |
| | | | | 257/773 |
| 2016/0197069 | A1* | 7/2016 | Morrow | H01L 27/0886 |
| | | | | 257/393 |
| 2016/0211276 | A1* | 7/2016 | Liu | H01L 27/0924 |
| 2016/0307788 | A1* | 10/2016 | Hu | H01L 21/486 |
| 2017/0069598 | A1* | 3/2017 | Nelson | H01L 23/5383 |
| 2017/0125383 | A1* | 5/2017 | Liu | G11C 8/12 |
| 2017/0200716 | A1* | 7/2017 | Or-Bach | H01L 27/0688 |
| 2017/0228529 | A1* | 8/2017 | Huang | H01L 23/3114 |
| 2018/0040511 | A1* | 2/2018 | Kamineni | H01L 23/53214 |
| 2018/0047707 | A1* | 2/2018 | Or-Bach | H01L 25/0657 |
| 2018/0102776 | A1* | 4/2018 | Chandrasekar | H01L 24/16 |
| 2018/0138116 | A1* | 5/2018 | Lin | H01L 23/49816 |
| 2018/0174959 | A1* | 6/2018 | Kim | H01L 23/5225 |
| 2018/0204932 | A1* | 7/2018 | Mehandru | H01L 27/1211 |
| 2018/0218946 | A1* | 8/2018 | Or-Bach | H01L 23/5252 |
| 2018/0219090 | A1* | 8/2018 | Morrow | H01L 24/00 |
| 2018/0240753 | A1* | 8/2018 | LaRoche | H01L 23/485 |
| 2018/0301380 | A1* | 10/2018 | Or-Bach | H03K 19/17704 |
| 2018/0323174 | A1* | 11/2018 | Mueller | H01L 21/76898 |
| 2018/0350685 | A1* | 12/2018 | Or-Bach | H01L 21/8221 |
| 2019/0067244 | A1* | 2/2019 | Chen | H01L 24/80 |
| 2019/0067284 | A1* | 2/2019 | Ching | H01L 29/66545 |
| 2019/0096864 | A1* | 3/2019 | Huitema | H01L 33/62 |
| 2019/0103309 | A1* | 4/2019 | Lin | H01L 29/7851 |
| 2019/0172826 | A1* | 6/2019 | Or-Bach | H01L 27/0688 |
| 2019/0259699 | A1* | 8/2019 | Morrow | H01L 29/401 |
| 2019/0273069 | A1* | 9/2019 | Or-Bach | H01L 29/66621 |
| 2019/0355713 | A1* | 11/2019 | Yu | H01L 23/5386 |
| 2019/0378790 | A1* | 12/2019 | Bohr | H01L 21/823481 |
| 2020/0051961 | A1* | 2/2020 | Rickard | H01L 23/49822 |
| 2020/0161298 | A1* | 5/2020 | Lilak | H01L 29/785 |
| 2020/0176420 | A1* | 6/2020 | Or-Bach | H01L 23/46 |
| 2020/0273779 | A1* | 8/2020 | Lilak | H01L 27/0688 |
| 2020/0373297 | A1* | 11/2020 | Nidhi | H01L 29/205 |
| 2020/0373421 | A1* | 11/2020 | Nidhi | H01L 29/7786 |
| 2020/0403007 | A1* | 12/2020 | Thomson | H01L 29/8613 |
| 2021/0043573 | A1* | 2/2021 | Eid | H01L 25/18 |
| 2021/0043574 | A1* | 2/2021 | Templeton | H01L 23/50 |
| 2021/0118699 | A1* | 4/2021 | Or-Bach | H01L 27/0207 |
| 2021/0118811 | A1* | 4/2021 | Lu | H01L 23/5389 |
| 2021/0167210 | A1* | 6/2021 | Bomberger | H01L 29/785 |
| 2021/0183794 | A1* | 6/2021 | Tang | H01L 23/481 |
| 2021/0193655 | A1* | 6/2021 | Or-Bach | H01L 21/8221 |
| 2021/0407980 | A1* | 12/2021 | Young | H10B 51/40 |
| 2022/0077140 | A1* | 3/2022 | Thomson | H01L 23/481 |
| 2022/0157983 | A1* | 5/2022 | Or-Bach | H01L 29/66795 |
| 2022/0359657 | A1* | 11/2022 | Wang | H01L 23/528 |

OTHER PUBLICATIONS

Non Final Office Action in U.S. Appl. No. 16/728,111 dated Jun. 30, 2021, 13 pages.

* cited by examiner

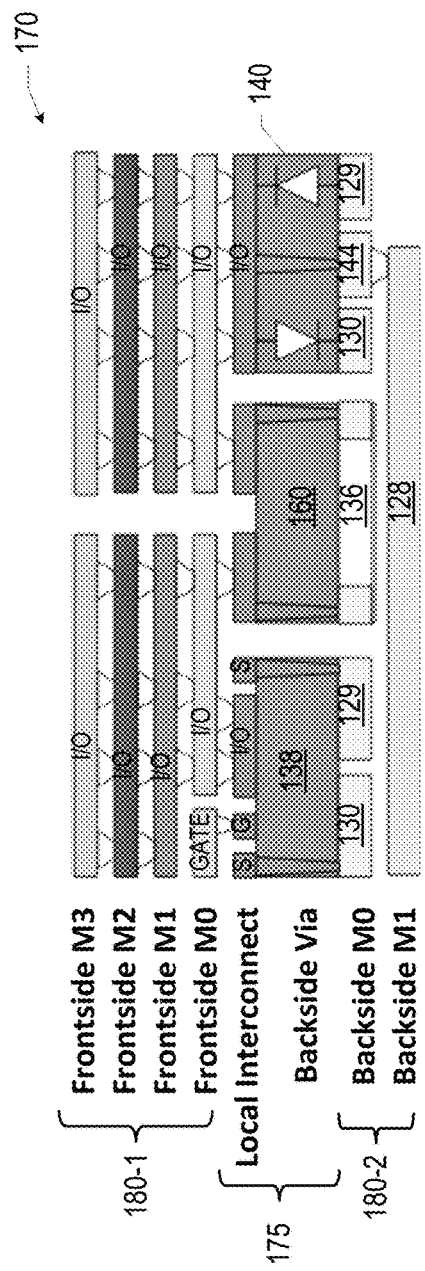
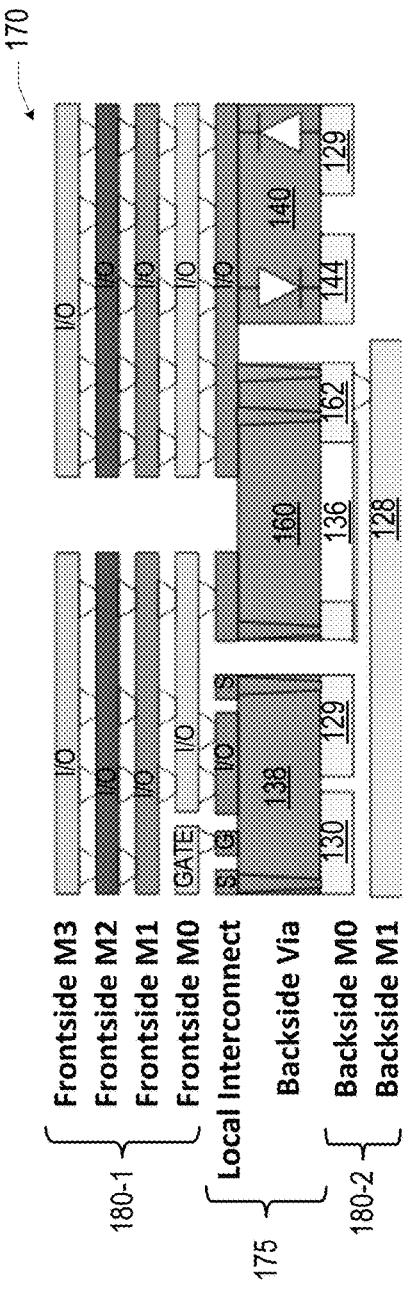
FIG. 15
FIG. 16

INTEGRATED CIRCUIT STRUCTURES INCLUDING BACKSIDE VIAS

CROSS-REFERENCE TO RELATED APPLICATION

This application is a divisional (and claims the benefit of priority under 35 U.S.C. § 120) of U.S. application Ser. No. 16/728,111, filed Dec. 27, 2019 and entitled INTEGRATED CIRCUIT STRUCTURES INCLUDING BACKSIDE VIAS. The disclosure of the prior application is considered part of and is incorporated by reference in the disclosure of this Application.

BACKGROUND

Conventional integrated circuit (IC) components may include a device layer and a metallization stack thereon; conductive contacts on the metallization stack allow electrical coupling between devices in the device layer and an external component. Such IC components may be considered "single-sided," as they include conductive contacts at only one face of the IC component.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 15-18 illustrate example IC structures implementing the I/O circuitry of FIG. 9 with a backside series resistance, in accordance with various embodiments.

DETAILED DESCRIPTION

Figure 1:
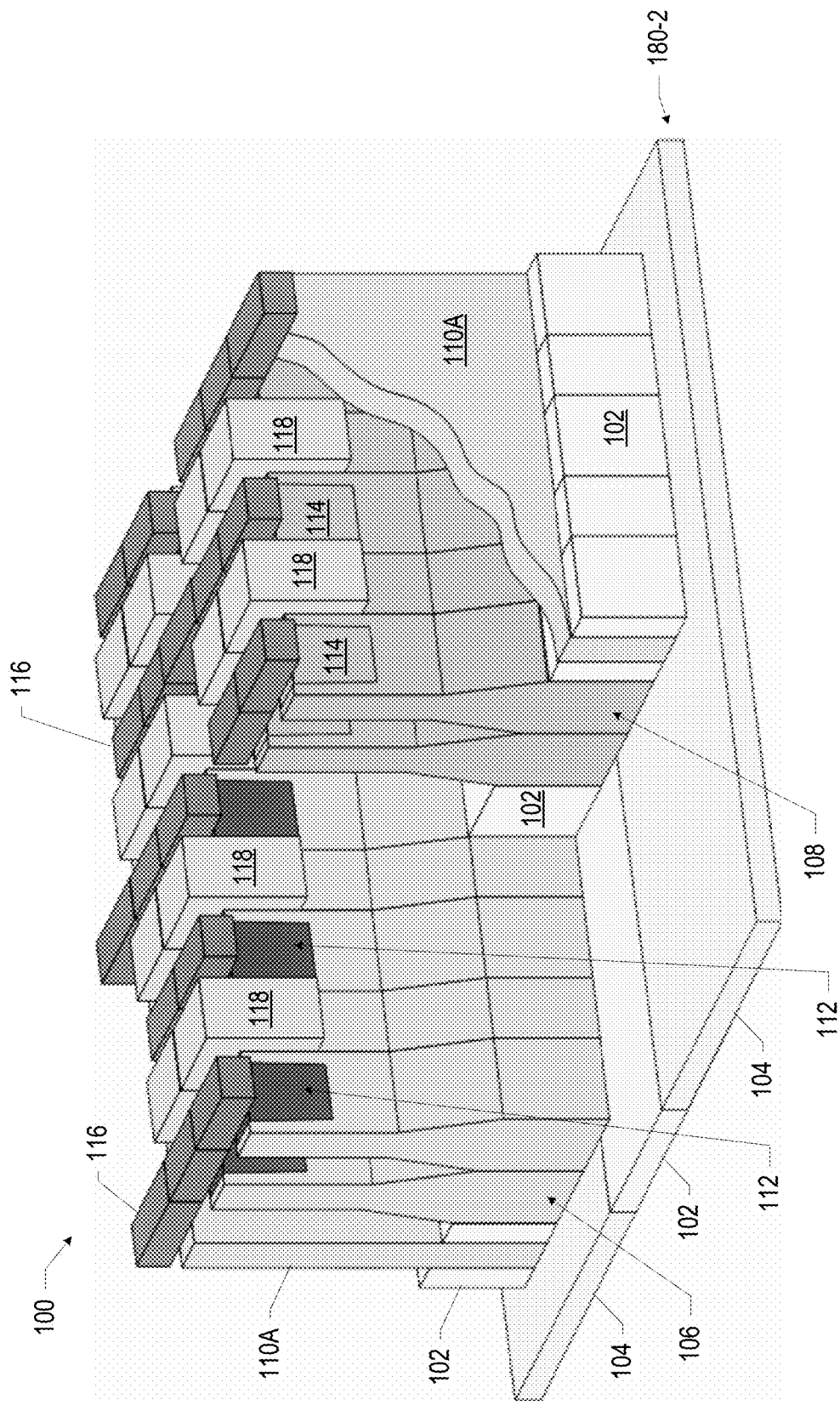
FIGS. 1 and 2 are perspective views of integrated circuit (IC) structures including an internal feedthrough arrangement for signal processing circuitry, in accordance with various embodiments.

Disclosed herein are integrated circuit (IC) structures including backside vias, as well as related methods and devices. In some embodiments, an IC structure may include: a device layer, wherein the device layer includes a plurality of active devices; a first metallization layer over the device layer, wherein the first metallization layer includes a first conductive pathway in conductive contact with at least one of the active devices in the device layer; a second metallization layer under the device layer, wherein the second metallization layer includes a second conductive pathway; and a conductive via in the device layer, wherein the conductive via is in conductive contact with at least one of the active devices in the device layer and also in conductive contact with the second conductive pathway.

Disclosed herein are structures for passing power and/or signals between backside metallization and active devices included in a device layer of an IC component (e.g., a die). With the emergence of 3D ICs (e.g., ICs including multiple stacked device layers) and silicon-on-insulator (SOI) technologies, conventional approaches to signal and/or power distribution may no longer be adequate. For example, conventionally, the communication of signals between active devices in an IC component and an external component takes place through conductive pathways that route up multiple layers of frontside metallization. Large landing pads may be disposed at the front side of the IC component to facilitate packaging connections (e.g., wire bonding pads, solder pads for flip chip packaging, etc.). To implement 3D ICs, signals may need to be passed through a device layer. Some previous approaches have included through-silicon vias (TSVs). Conventional TSVs may be large metal vias that are drilled through the thickness of a substrate of the device layer to pass a signal between the device layer and the backside.

Conventional frontside metallization and TSVs may not adequately facilitate high-quality signal pass through in modern, complex electronics. For example, using conventional frontside metallization approaches may require conductive pathways that route to the top-level metals in an IC component, and complex devices may require many metal layers. Off-die signals must traverse all of these metal layers to get to the top-level metal, where they may be routed to the pad location. This may create a significant series resistance as the metal stack is traversed. When power is also routed to the top-level frontside metal layers, these disadvantages may be exacerbated. Conventional TSVs are typically large due to the thickness of the material they must route through, resulting in a large footprint, leading to larger die areas and increased cost. TSVs also typically include a large keep out zone around them to avoid causing undesirable variation in nearby active devices, further increasing die area and cost. Due to the distance a signal must travel to get to a TSV, any off-die signal may be routed up to the higher-level metals (which are typically thicker than lower-level metals) for lower series routing resistance to the TSV, further straining routing resources.

The feedthrough structures disclosed herein may utilize backside vias to couple a device layer to backside metallization. Such backside vias may travel a much shorter distance than conventional TSVs, and may be tightly integrated with the circuitry they support (rather than requiring a large keep out zone). Integrating the signal feedthrough tightly with the device layer (i.e., the front-end-of-line (FEOL) devices), the routing distance may be greatly reduced, reducing the resistance along the route and the footprint required for such routing. Further, the use of backside vias may mitigate the need for upper-level metals in the making of off-die connections, thereby freeing up resources for on-die circuit routing (and potentially leading to reduced numbers of metal layers, and therefore reduced cost and complexity). In some embodiments, more complex circuit wiring may be confined to the frontside metallization layers, allowing the backside metallization layers to be made of thicker metals with lower resistance and higher current limits.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIGS. 1-8 illustrate various embodiments of IC structures 100 including one or more backside vias 110. In FIGS. 1-8, IC structures 100 with four semiconductor bodies (e.g., four fins) are depicted, but this is simply for ease of illustration, and any suitable number of semiconductor bodies may be included in an IC structure 100. Similarly, the number and arrangement of backside vias 110, the number of epitaxially grown regions ("epi regions") 112 and 114, the number and arrangement of local interconnects 116, and the number and arrangement of gate electrodes 118 may be varied as suitable. In various embodiments, the IC structures 100 depicted in FIGS. 1-8 may be a small portion of a larger full array of IC structures 100.

Figure 2:
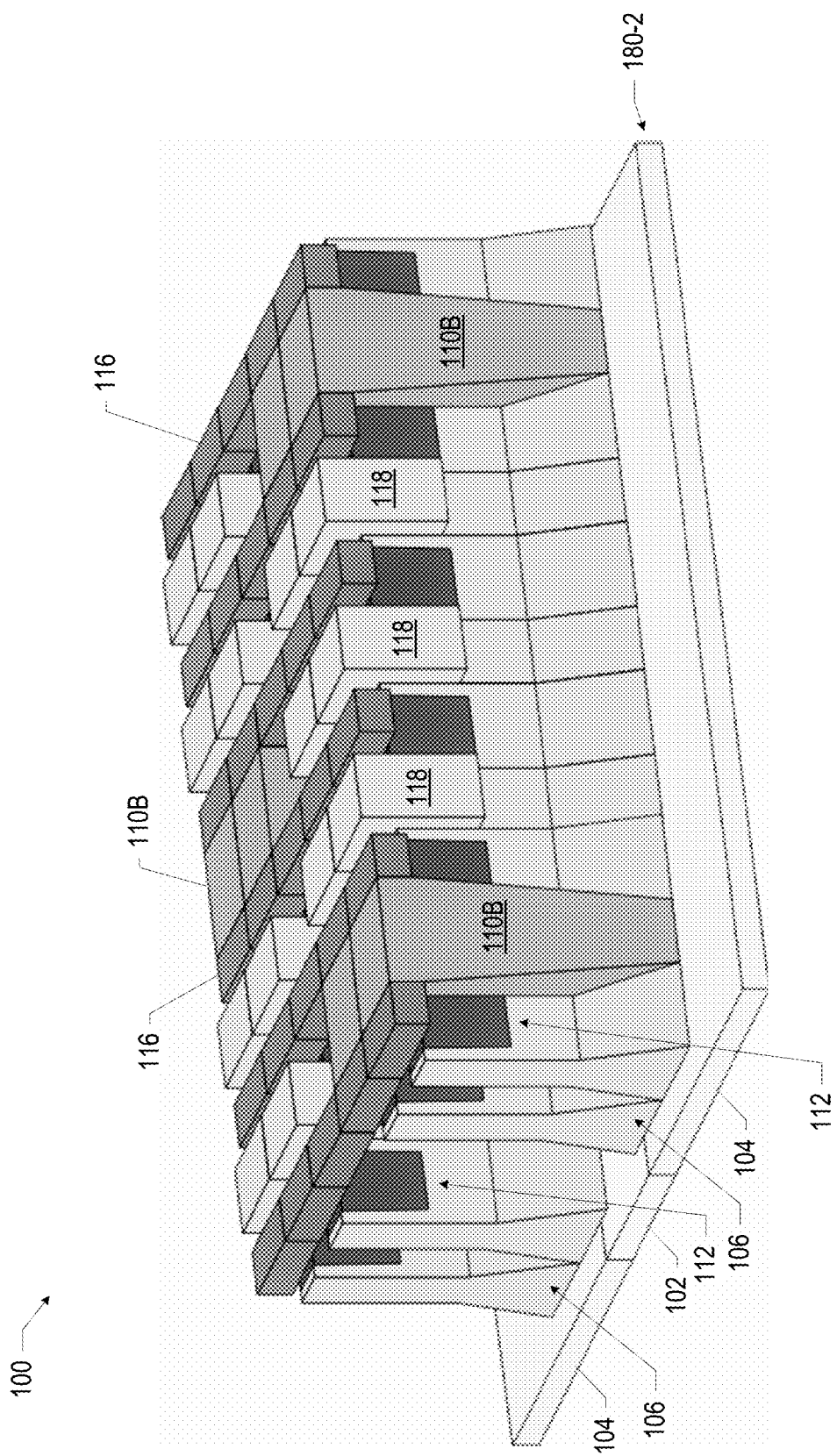

FIGS. 1 and 2 are perspective views of IC structures 100 including an internal feedthrough arrangement for signal processing circuitry, in accordance with various embodiments. The IC structure 100 of FIG. 1 may include parallel backside vias 110A, while the IC structure 100 of FIG. 2 may include body-cut backside vias 110B. In some embodiments, an IC structure 100 like those of FIGS. 1 and 2 may include both parallel backside vias 110A and body-cut backside vias 110B, as desired. In some embodiments, the IC structures 100 of FIGS. 1 and 2 may include substrateless fin-based transistors (e.g., transistors having a FinFET design without a global semiconductor substrate or a bulk silicon layer, such as FinFETs on an SOI or thin semiconductor substrate). In some embodiments, the IC structures 100 of FIGS. 1 and 2 may be included in driver circuitry 138 of a backside I/O IC structure 170, as discussed below with reference to FIGS. 10-18. Further, the IC structures 100 of FIGS. 1 and 2 may be utilized for signal feedthrough and/or power delivery, as desired.

Turning to FIG. 1, the IC structure 100 may include an N-type body region 106 and a P-type body region 108 disposed over portions of backside metallization 104 separated by an insulating material 102. The backside metallization 104, and coplanar insulating material 102, may be part of a backside metallization stack 180-2, as discussed further below. Further insulating material 102 may be disposed between the N-type body region 106 and the P-type body region 108. In some embodiments, the insulating material 102 may include glass, silicon oxide, carbon-doped oxide (CDO), silicon nitride, organic polymers such as perfluorocyclobutane and/or polytetrafluoroethylene, fluorosilicate glass (FSG), and/or organo-silicates, such as silsesquioxane, siloxane, and/or organosilicate glass. In some embodiments, multiple P-type epitaxially grown regions 112 (referred to herein as "P-type epi regions 112") and multiple gate electrodes 118 may be disposed over the N-type body region 106, and multiple N-type epitaxially grown regions 114 (referred to herein as "N-type epi regions 114") and multiple gate electrodes 118 may be disposed over the P-type body region 108. The gate electrodes 118 may be positioned between adjacent pairs of P-type epi regions 112 over the N-type body region 106, and positioned between adjacent pairs of N-type epi regions 114 over the P-type body region 108.

The body regions 106/108 may each include one or more semiconductor bodies (e.g., semiconductor-based fins, as shown). The body regions 106/108 may include N-type or P-type materials systems (or a combination of both). The semiconductor material or materials included in the body regions 106/108 may include any suitable semiconductor material, such as silicon, germanium, indium antimonide, lead telluride, indium arsenide, indium phosphide, gallium nitride, gallium arsenide, gallium antimonide, or suitable combinations thereof. Further materials classified as group II-VI, III-V, or IV may be included in the body regions 106/108.

The gate electrodes 118 may be spaced apart from the underlying body regions 106/108 by a gate dielectric (not shown). The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrodes 118 may be disposed on the gate dielectric and may include at least one P-type work function metal or N-type work function metal, depending on whether the underlying transistor is to be a P-type metal oxide semiconductor (PMOS) or an N-type metal oxide semiconductor (NMOS) transistor. In some implementations, the gate electrode 118 may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode 118 include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode 118 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, a gate electrode 118 may include polysilicon. In some embodiments, a single gate electrode 118 may extend across multiple semiconductor bodies (e.g., across multiple fins in the N-type body region 106, and/or across multiple fins in the P-type body region 108)

In some embodiments, a pair of sidewall spacers (not shown) may be present on opposing sides of the gate to bracket the gate. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The P-type epi regions 112 and the N-type epi regions 114 may serve as source/drain (S/D) regions in the transistor. To form the epi regions 112/114, the body regions 106/108 may first be etched to form recesses at the locations of the epi regions 112/114. An epitaxial deposition process may then be carried out to fill the recesses with material that provides the epi regions 112/114. In some implementations, the epi regions 112/114 may be fabricated using a silicon alloy such as silicon germanium or silicon carbide. In some embodiments, the epitaxially deposited silicon alloy may be doped in situ with dopants such as boron, arsenic, or phosphorous. In some embodiments, the epi regions 112/114 may be formed using one or more alternate semiconductor materials such as germanium or a group III-V material or alloy. In further embodiments, one or more layers of metal and/or metal alloys may be used to form the epi regions 112/114. Although the term "epi regions" is used, in some embodiments, the epi regions 112/114 may not be formed by an epitaxial process, but may be formed instead using an implantation/diffusion process, for example. In such a process, dopants such as boron, aluminum, antimony, phosphorous, or arsenic may be ion-implanted into the body regions 106/108 to form the regions 112/114. An annealing process that activates the dopants and causes them to diffuse farther into the body regions 106/108 may follow the ion-implantation process.

Multiple local interconnects 116 may be in contact with various ones of the N-type epi regions 114 and the P-type epi regions 112 to provide conductive pathways between different elements of the IC structure 100. In some embodiments, the local interconnects 116 may conductively couple various ones of the epi regions 112/114 across different body regions 106/108, and/or may conductively couple various ones of the epi regions 112/114 to a parallel backside via 110A. The parallel backside vias 110A may be disposed vertically on the backside metallization 104, and may be positioned adjacent to the outer edges of the body regions 106/108.

The parallel backside vias 110A may be oriented parallel to the fins of body regions 106/108 and may be spaced apart from the proximate body regions 106/108 by an intervening portion of insulating material 102. In some embodiments, this intervening portion of insulating material 102 may have a thickness that is less than a thickness of the parallel backside vias 110A. In some embodiments, the parallel backside vias 110A may have a thickness that is substantially equal to a thickness of the proximate body regions 106/108. In some embodiments, the top surfaces of the parallel backside vias 110A may be substantially coplanar with the top surfaces of the body regions 106/108, as shown, with the local interconnects 116 disposed on both of the top surfaces of the parallel backside vias 110A and the proximate body regions 106/108. In some embodiments, the local interconnects 116 coupling a parallel backside via 110A to a proximate body region 106/108 may have a length that extends beyond the point of contact of the local interconnects 116 with the parallel backside via 110A and the proximate body region 106/108, as shown.

In some embodiments, the parallel backside vias 110A may include a conductive material, such as aluminum, copper, tungsten, metal alloys (e.g., an alloy of aluminum and copper), and/or any other suitable material for forming an electrical contact between the local interconnects 116 and the backside metallization 104. The arrangement of the parallel backside vias 110A and the body regions 106/108 in FIG. 1 may be referred to as an "internal feedthrough" arrangement because the backside vias 110 are close to the active devices with which they conductively couple; for example, electrical coupling between the parallel backside vias 110A and the epi regions 112/114 may be achieved by local interconnects 116 (rather than requiring conductive pathways through a frontside metallization stack 180-1, as discussed further below).

FIG. 2 depicts another example of an IC structure 100 including an internal feedthrough arrangement for signal processing circuitry, in accordance with various embodiments. The IC structure 100 of FIG. 2 may share many elements with the IC structure 100 of FIG. 1; those elements may take any of the forms disclosed herein, and a discussion of those elements is not repeated. Instead of parallel backside vias 110A (as depicted in FIG. 1), the IC structure 100 of FIG. 2 may include body-cut backside vias 110B. The body-cut backside vias 110B may be oriented perpendicular to the fins of body regions 106/108 and may directly contact the epi regions 112/114. In some embodiments, the body-cut backside vias 110B may have a thickness that is greater than a thickness of the proximate body regions 106/108, as shown. In some embodiments, the top surfaces of the body-cut backside vias 110B may be substantially coplanar with the top surfaces of the local interconnects 116. In some embodiments, the top surfaces of the body-cut backside vias 110B may be lower than the top surfaces of the gate electrodes 118, as shown.

The body-cut backside vias 110B may include any of the materials discussed above with reference to the parallel backside vias 110A. The arrangement of the body-cut backside vias 110B and the body regions 106/108 in FIG. 2 may also be referred to as an "internal feedthrough" arrangement because the backside vias 110 are close to the active devices with which they conductively couple; for example, electrical coupling between the body-cut backside vias 110B and the epi regions 112/114 may be achieved by direct contact (e.g., direct contact between the body-cut backside vias 110B and the epi regions 112/114 and/or direct contact between the body-cut backside vias 110B and conductive contacts disposed on the epi regions 112/114).

Figure 3:
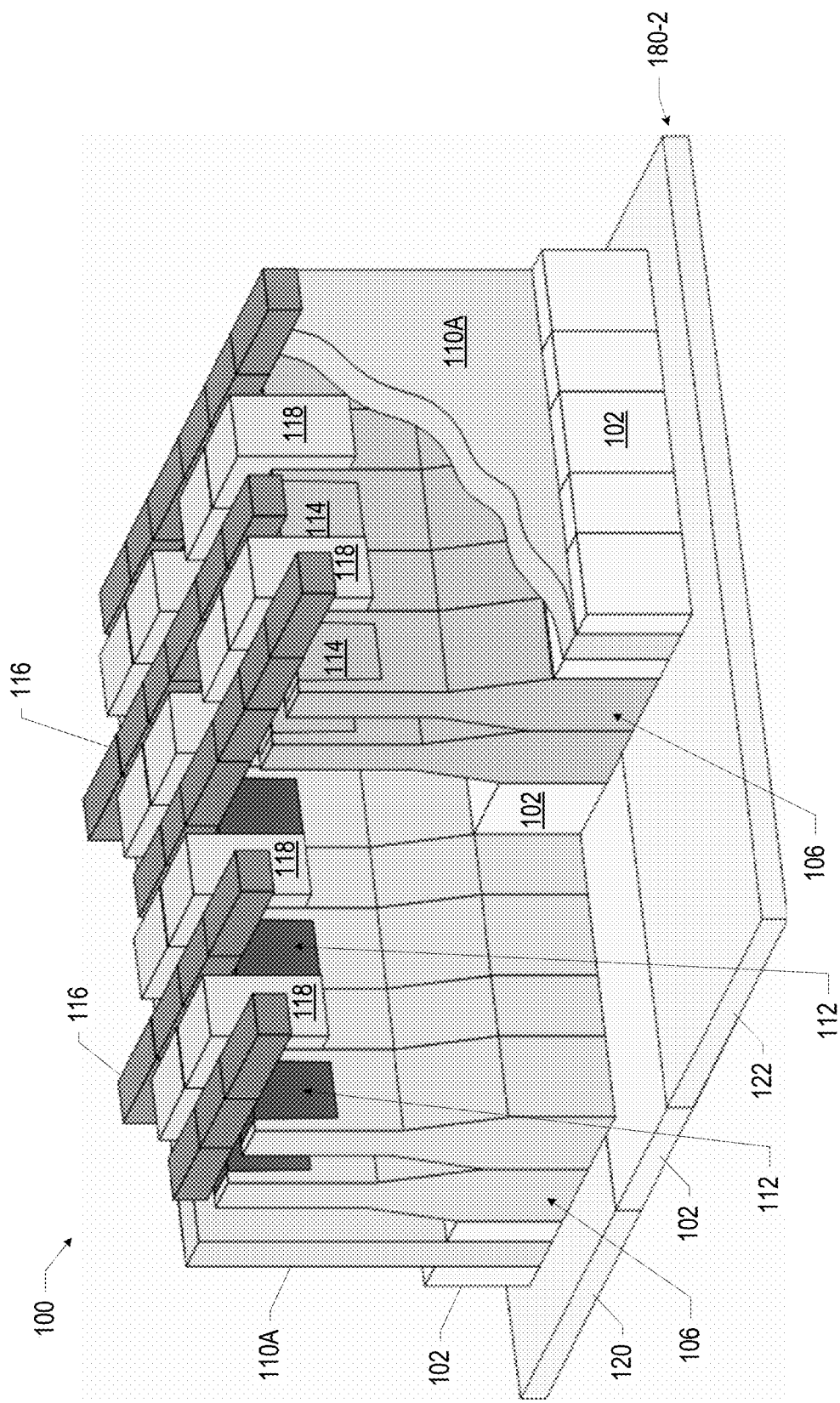
FIGS. 3 and 4 are perspective views of IC structures including an internal feedthrough arrangement for power gate circuitry, in accordance with various embodiments.
Figure 4:
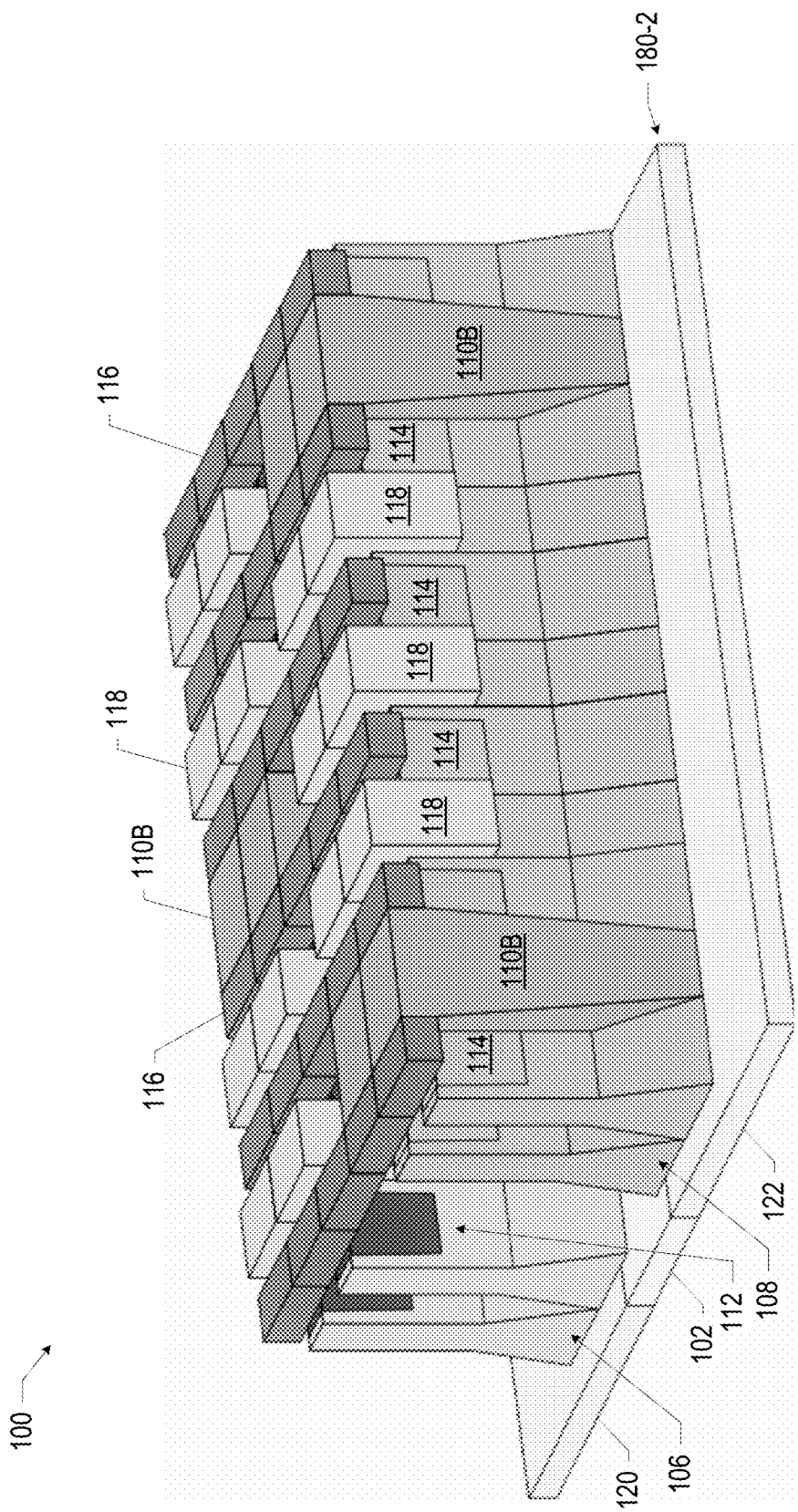

FIGS. 3 and 4 are perspective views of IC structures 100 including an internal feedthrough arrangement for power gate circuitry, in accordance with various embodiments. The IC structure 100 of FIG. 3 may include parallel backside vias 110A, while the IC structure 100 of FIG. 4 may include body-cut backside vias 110B. In some embodiments, an IC structure 100 like those of FIGS. 3 and 4 may include both parallel backside vias 110A and body-cut backside vias 110B, as desired. In some embodiments, the IC structures 100 of FIGS. 3 and 4 may include substrate-less fin-based transistors (e.g., transistors having a FinFET design without a global semiconductor substrate or a bulk silicon layer, such as FinFETs on an SOI or thin semiconductor substrate). Like I/O circuits, feedthroughs may substantially affect the performance of gated power supplies. In gated power supply circuits, output capacitance may be desirable, which may make the use of internal feedthrough structures advantageous. Alternatively, external feeder structures (e.g., those discussed below with reference to FIGS. 7 and 8) may be used if a lower output capacitance is targeted. Since the gated power output rail 122 may be intended to be switched off, it may be important to mitigate the presence of parasitic diodes that may weakly power the gated supply.

The IC structures 100 of FIGS. 3 and 4 may share many elements with the IC structures 100 of FIGS. 1 and 2, respectively; those elements may take any of the forms disclosed herein, and a discussion of those elements is not repeated. In the particular IC structures 100 of FIGS. 3 and 4, the N-type body region 106 may be disposed on a power supply rail 120 (e.g., Vcc) while the P-type body region 108 may be disposed on a gated power output rail (e.g., Vcc_out) 122. The power supply rail 120 and the gated power output rail 122 may be part of a backside metallization stack 180-2, as discussed below. The power supply rail 120 and the gated power output rail 122 may be separated by an insulating material 102, as discussed above with reference to the insulating material 102 between the portions of backside metallization 104. In FIGS. 3 and 4, particular polarities of the body regions 106/108 are shown as contacting the power supply rail 120/gated power output rail 122, but in some embodiments, an insulating material (not shown) may be disposed between the power supply rail 120/gated power output rail 122 and the body regions 106/108 so that the body regions 106/108 are not in contact with the power supply rail 120/gated power output rail 122. In such embodiments, the polarities (e.g., N-type or P-type) of the body regions 106/108 may be reversed, or two body regions of the same polarity (e.g., both N-type or both P-type) may be used (and may be accompanied by a simplification in the control circuitry). In other embodiments, the body region over the gated power output rail 122 may be shorted or otherwise dummified so that the body region serves principally as a point of contact for the gated power output rail 122.

Figure 5:
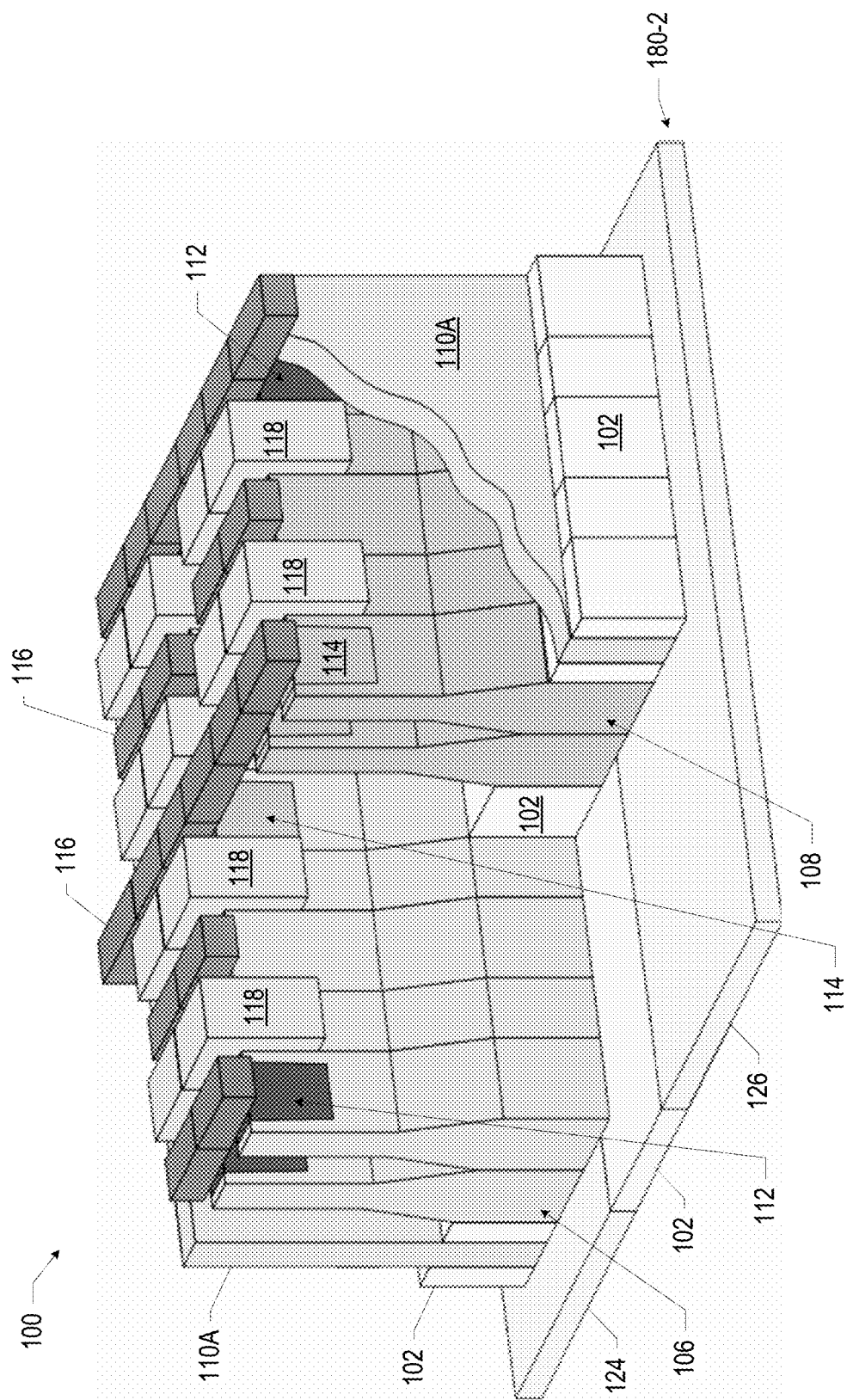
FIGS. 5 and 6 are perspective views of IC structures including an internal feedthrough arrangement for electrostatic discharge protection (ESDP) circuitry, in accordance with various embodiments.
Figure 6:
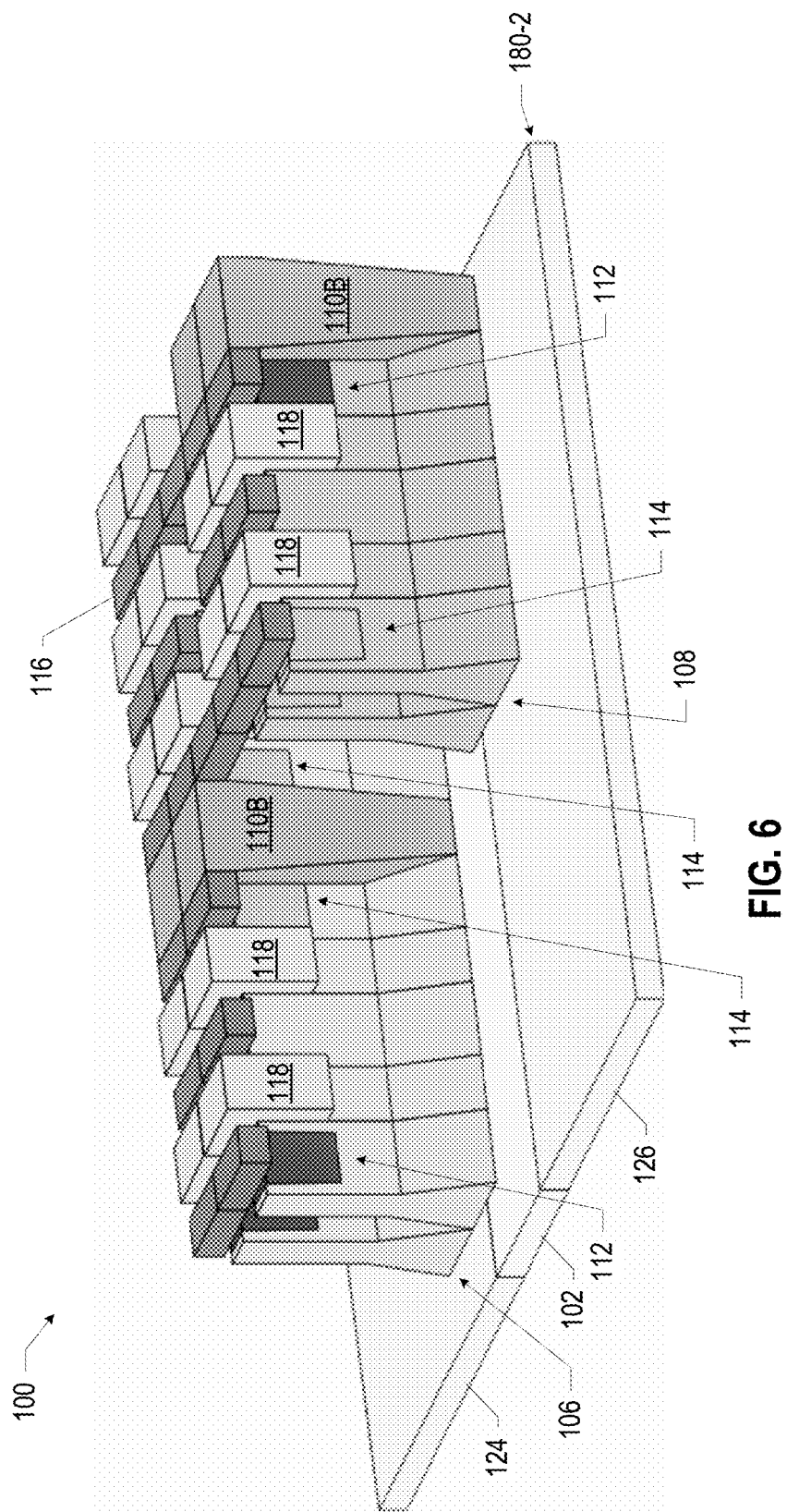

FIGS. 5 and 6 are perspective views of IC structures 100 including an internal feedthrough arrangement for electrostatic discharge protection (ESDP) circuitry, in accordance with various embodiments. The IC structure 100 of FIG. 5 may include parallel backside vias 110A, while the IC structure 100 of FIG. 6 may include body-cut backside vias 110B. In some embodiments, an IC structure 100 like those of FIGS. 5 and 6 may include both parallel backside vias 110A and body-cut backside vias 110B, as desired. In some embodiments, the IC structures 100 of FIGS. 5 and 6 may include substrate-less fin-based diodes (e.g., diodes having a FinFET-based design without a global semiconductor substrate or a bulk silicon layer, such as FinFETs on an SOI or thin semiconductor substrate). In ESDP settings, it may be important to reduce the resistance, and hence the voltage drop, across the conductive pathways in a metallization stack 180 in order to prevent the pad voltage (e.g., the voltage at the I/O pad 128 of the I/O circuitry 150 of FIG. 9, discussed below) from rising high enough to damage the I/O circuitry. For this reason, integrating power and signal feedthroughs into an ESDP array (e.g., a diode array), such as in the IC structures 100 of FIGS. 5 and 6, may achieve superior ESDP performance.

The IC structures 100 of FIGS. 5 and 6 may share many elements with the IC structures 100 of FIGS. 1 and 2, respectively; those elements may take any of the forms disclosed herein, and a discussion of those elements is not repeated. In the particular IC structures 100 of FIGS. 5 and 6, the N-type body region 106 may be disposed on cathode region 124 while the P-type body region 108 may be disposed on an anode region 126. The cathode region 124 and the anode region 126 may be part of a backside metallization stack 180-2, as discussed below. The cathode region 124 and the anode region 126 may be separated by an insulating material 102, as discussed above with reference to the insulating material 102 between the portions of backside metallization 104. Further, in the particular IC structures 100 of FIGS. 5 and 6, the epi regions 112/114 of the N-type body region 106 may alternate in polarity along the N-type body region 106, and the epi regions 112/114 of the P-type body region 108 may alternate in polarity along the P-type body region 108, as shown. In FIGS. 5 and 6, a short section of local interconnect 116 is shown as disposed on a "gap" portion of the N-type body region 106 (P-type body region 108) between adjacent gate electrodes 118; in some embodiments this gap portion of the N-type body region 106 (P-type body region 108) may not be present. In some embodiments, the IC structures 100 of FIGS. 5 and 6 may be included in ESDP circuitry 140 of a backside I/O IC structure 170, as discussed below with reference to FIGS. 10-18.

Figure 7:
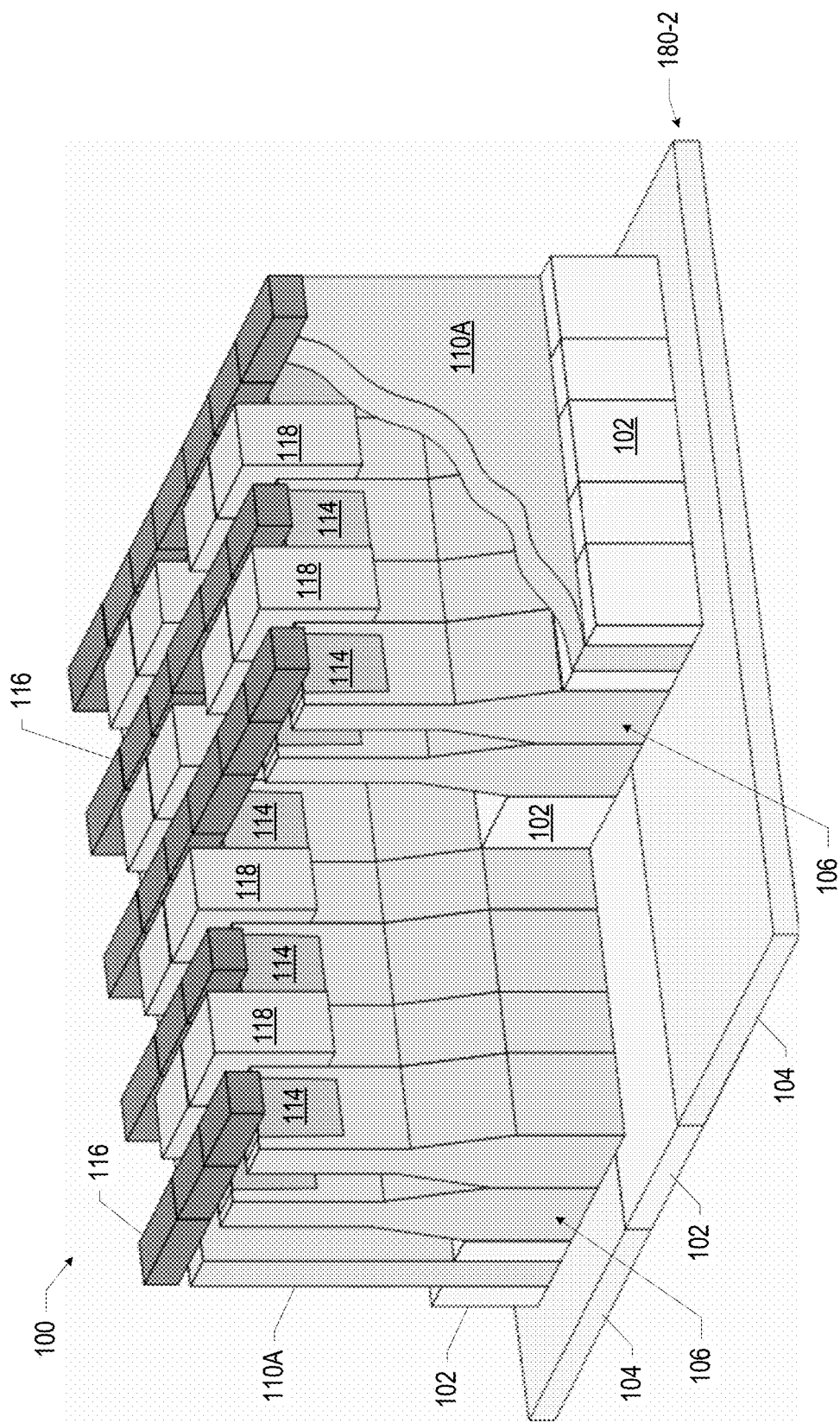
FIGS. 7 and 8 are perspective views of IC structures including an external feedthrough arrangement, in accordance with various embodiments.
Figure 8:
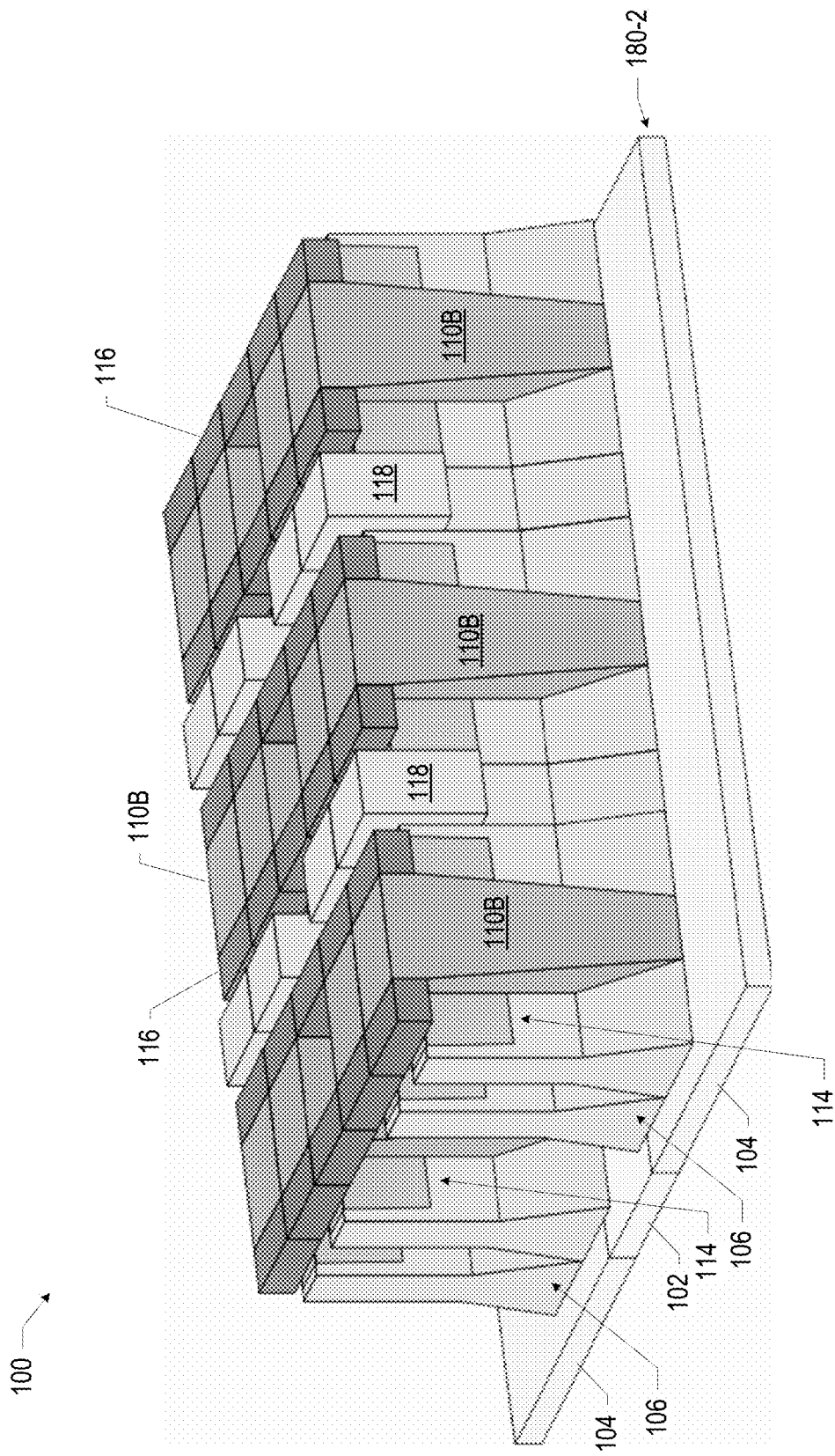

FIGS. 7 and 8 are perspective views of IC structures 100 including an external feedthrough arrangement, in accordance with various embodiments. The IC structure 100 of FIG. 7 may include parallel backside vias 110A, while the IC structure 100 of FIG. 8 may include body-cut backside vias 110B. In some embodiments, an IC structure 100 like those of FIGS. 7 and 8 may include both parallel backside vias 110A and body-cut backside vias 110B, as desired. The IC structures 100 of FIGS. 7 and 8 may share many elements with the IC structures 100 of FIGS. 1 and 2, respectively; those elements may take any of the forms disclosed herein, and a discussion of those elements is not repeated. However, in the IC structures 100 of FIGS. 7 and 8, the body regions 106/108, epi regions 112/114, gate electrodes 118, and local interconnects 116 may be dummy structures, and may not provide any active devices; consequently, the number and polarity of body regions and the number and polarity of epi regions 112/114 may be changed from those illustrated in FIGS. 7 and 8 while maintaining the external feedthrough structure. In some embodiments, the dummy gate electrodes 118 of FIGS. 7 and 8 may be left floating, or may be coupled to power or ground, rather than being electrically coupled to control circuitry as an active device (e.g., a transistor, a diode, etc.) would be. The IC structures 100 of FIGS. 7 and 8 may be fabricated simultaneously with analogous active IC structures 100 (e.g., located in other regions of a die 1502, discussed below with reference to FIG. 19), but may be utilized to support conductive coupling between a backside metallization stack 180-2 and a frontside metallization stack 180-1 (as shown in FIG. 20). However, the IC structures 100 of FIGS. 7 and 8 may be utilized (e.g., principally or solely) to provide access to a backside metallization stack 180-2 by regions of the device layer 175, instead of or in addition to the use of an internal feedthrough arrangement (e.g., an internal feedthrough arrangement including a parallel backside via 110A or a body-cut backside via 110B). In particular, a region of the device layer 175 may be conductively coupled to the IC structure 100 of FIG. 7 or 8 by a conductive pathway through a frontside metallization stack 180-1 (discussed below), and may use the backside vias 110 included in that IC structure 100 to achieve conductive coupling to a backside metallization stack 180-2. The IC structures 100 of FIGS. 7 and 8 may be referred to as "external feedthrough" arrangements because the backside vias 110 are less close to the active devices with which they conductively couple than the internal feedthrough arrangements discussed above; for example, electrical coupling between the backside vias 110 of the IC structures 100 of FIGS. 7 and 8 and an active device region (including, e.g., diodes and/or transistors) may include a conductive pathway through a frontside metallization stack 180-1.

Figure 9:
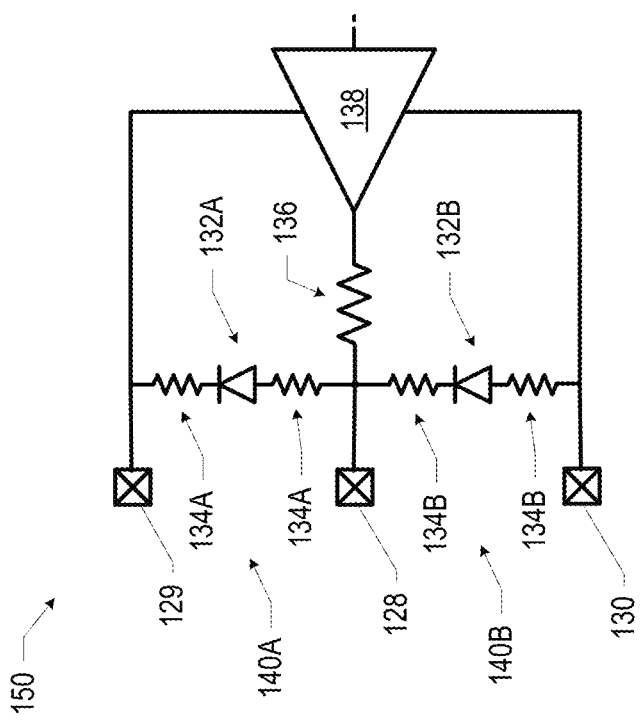
FIG. 9 is a schematic of I/O circuitry that may be implemented using one or more internal feedthrough arrangements and/or one or more external feedthrough arrangements, in accordance with various embodiments.

The internal feedthrough and/or external feedthrough arrangements disclosed herein may be utilized in any of a number of settings. For example, the internal feedthrough and/or external feedthrough arrangements disclosed herein may be advantageously utilized in the I/O circuitry setting. FIG. 9 is a schematic of I/O circuitry 150 that may be implemented using one or more internal feedthrough arrangements and/or one or more external feedthrough arrangements, in accordance with various embodiments. The I/O circuitry 150 may include driver circuitry 138 (e.g., output driver circuitry) whose output is coupled through a series resistance 136 to an I/O pad 128. In some embodiments, the series resistance 136 may be used to terminate a high-speed line, while in other embodiments, the series resistance 136 may not be present. Examples of embodiments in which no series resistance 136 is present are discussed in further detail below with reference to FIGS. 10-12. The I/O pad 128 may be coupled through ESDP circuitry 140A to a positive power supply rail (e.g., Vcc); the ESDP circuitry 140A may include a diode 132A and accompanying branch-point resistances 134A. The I/O pad 128 may also be coupled through ESDP circuitry 140B to a negative power supply rail (e.g., Vss); the ESDP circuitry 140B may include a diode 132B and accompanying branch-point resistances 134B. When current flows through the branch-point resistances 134, the voltage seen at the I/O pad 128 may increase (with respect to the power nets during an electrostatic discharge event), and thus may increase the stress experienced by the transistors of the driver circuitry 138.

The ESDP circuitry 140A and the ESDP circuitry 140B may be collectively referred to as ESDP circuitry 140 in the following discussion. The ESDP circuitry 140 and the driver circuitry 138 of the I/O circuitry 150 may include internal feedthrough arrangements and/or external feedthrough arrangements in accordance with any of the embodiments disclosed herein. FIGS. 10-18 depict example backside I/O IC structures 170 including the internal feedthrough and/or external feedthrough arrangements in various configurations, but these IC structures 170 are simply illustrative, and the internal feedthrough/external feedthrough arrangements disclosed herein may be used in any desired configuration. In the discussion of FIGS. 10-18, the IC structures 170 may include one or more interconnect layers in a frontside metallization stack 180-1, one or more interconnect layers in a backside metallization stack 180-2, and a device layer 175 including local interconnects (e.g., any of the local interconnects 116 disclosed herein) and backside vias (e.g., any of the backside vias 110 disclosed herein). In the IC structures 170, I/O signals may be transmitted and/or received via conductive contacts on the backside metallization stack 180-2 of a component (e.g., the conductive contacts 1636-2 discussed below with reference to FIG. 20). The number of layers in the metallization stacks 180 in FIGS. 10-18 is simply illustrative, and any suitable number may be used.

As noted above with reference to FIGS. 5 and 6, integrating power and signal feedthroughs internally in an ESDP array may achieve improved ESDP performance. However, for high-speed I/O's, total pad capacitance may also be an important metric. By integrating the power and signal feedthroughs within the ESDP circuitry 140 or the driver circuitry 138, more interactions between the I/O pad 128 and the power supply rails 129 and 130 may be present, ultimately leading to a higher pad capacitance. Consequently, the use of external feedthrough arrangements may be advantageous in certain settings, and thus the advantages and disadvantages of internal feedthrough and external feedthrough arrangements may be balanced for various performance requirements. For example, since capacitance between power nets (e.g., Vcc and ground) may improve performance, in some embodiments, power delivery may be implemented using internal feedthrough structures while other pathways may be implemented using external feedthrough structures.

Figure 10:
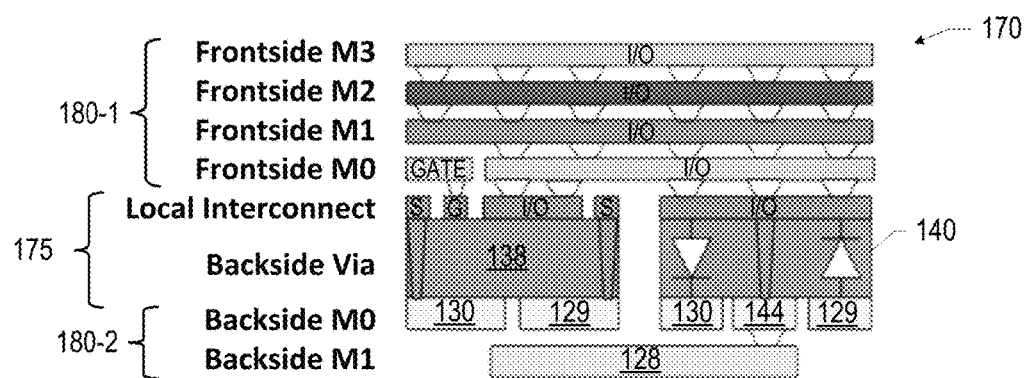
FIGS. 10-12 illustrate example IC structures implementing the I/O circuitry of FIG. 9 without a series resistance, in accordance with various embodiments.
Figure 11:
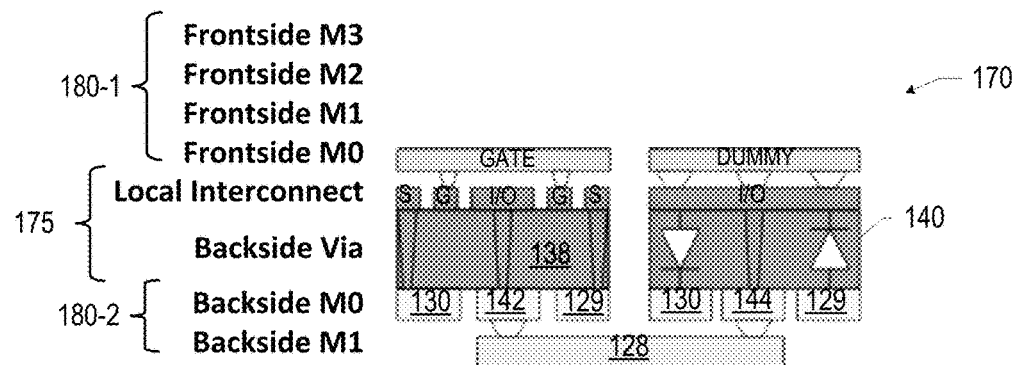
Figure 12:
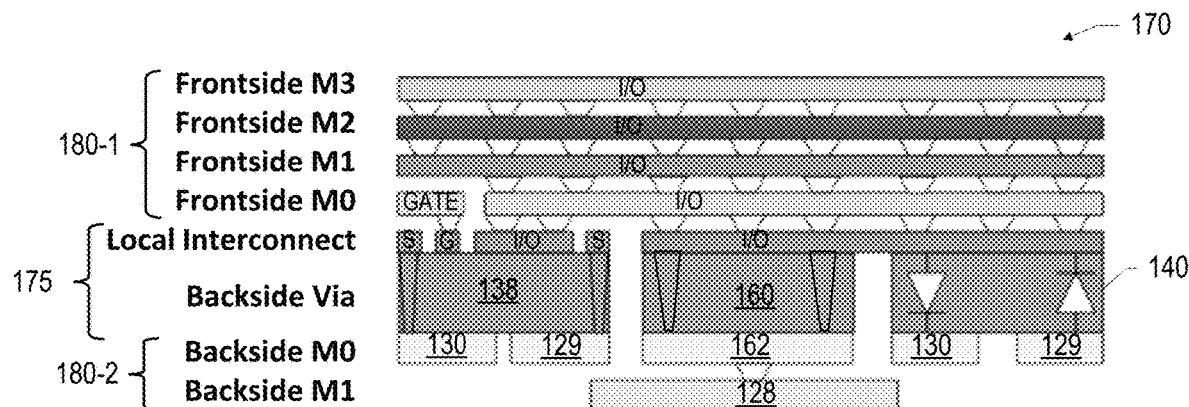

FIGS. 10-12 illustrate example IC structures 170 implementing the I/O circuitry 150 of FIG. 9 without a series resistance 136, in accordance with various embodiments. When no series resistance 136 is needed, an I/O signal (transmitted to the IC structure 170 through the frontside metallization stack 180-1) may connect to the ESDP circuitry 140 and also may be fed through to the backside metallization stack 180-2. FIG. 10 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1. The I/O signal pathways through the frontside metallization stack 180-1 may couple to the ESDP circuitry 140, which may include diodes (e.g., the diodes 132 discussed above with reference to FIG. 9, not labeled in FIG. 10) coupled to the positive power supply 129 and the negative power supply 130 (included in the backside metallization stack 180-2) using backside vias in an internal feedthrough arrangement (e.g., as discussed above with reference to FIGS. 5-6), as well as one or more backside vias in an internal feedthrough arrangement (e.g., as illustrated in FIGS. 1-2) to couple the I/O signal pathways to the I/O pad 128 via a backside I/O metallization 144 (also included in the backside metallization stack 180-2). In the embodiment of FIG. 10, a high pad capacitance may be seen within the ESDP circuitry 140, but may not be seen within the driver circuitry 138. Further, the branch-point resistance 134 may be mitigated, yielding a robust ESDP design. However, routing resources in the frontside metallization stack 180-1 may be used to route the I/O signal, and DC current density in the frontside metallization stack 180-1 may increase.

FIG. 11 depicts an embodiment in which the driver circuitry 138 includes backside vias 110 to the positive power supply 129 and the negative power supply 130 (included in the backside metallization stack 180-2) using backside vias in an internal feedthrough arrangement, and is also coupled to the I/O pad 128 (included in the backside metallization stack 180-2) through one or more backside vias in an internal feedthrough arrangement (e.g., as illustrated in FIGS. 1-2) and via a backside I/O metallization 142. The ESDP circuitry 140 may include diodes (e.g., the diodes 132 discussed above with reference to FIG. 9, not labeled in FIG. 11) to the positive power supply 129 and the negative power supply 130 (included in the backside metallization stack 180-2) using backside vias in an internal feedthrough arrangement (e.g., as discussed above with reference to FIGS. 5-6), as well as one or more backside vias in an internal feedthrough arrangement (e.g., as illustrated in FIGS. 1-2) to couple to the I/O pad 128 (also included in the backside metallization stack 180-2) via a backside I/O metallization 144. In the embodiment of FIG. 11, routing resources and the frontside metallization stack 180-1 may be saved (relative to the embodiment of FIG. 10) at a cost of increased pad capacitance, which may be challenging for high-speed I/Os.

FIG. 12 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1. The I/O signal pathways through the frontside metallization stack 180-1 may couple to the ESDP circuitry 140, which may include diodes (e.g., the diodes 132 discussed above with reference to FIG. 9, not labeled in FIG. 12) coupled to the positive power supply 129 and the negative power supply 130 (included in the backside metallization stack 180-2) using backside vias in an internal feedthrough arrangement (e.g., as discussed above with reference to FIGS. 5-6). The I/O signal pathways may couple the ESDP circuitry 140 to an external feedthrough structure 160 (e.g., as discussed above with reference to FIGS. 7-8) through conductive pathways in the frontside metallization stack 180-1. Backside vias in the external feedthrough structure 160 may couple the I/O signal pathways to the I/O pad 128 (also included in the backside metallization stack 180-2) via a backside I/O metallization 162. In the embodiment of FIG. 12, a lower pad capacitance may be achieved than the embodiments of FIGS. 10 and 11, and therefore may be most suited to certain high-speed I/O applications. Other topologies in addition to those illustrated in FIGS. 10-12 may be used (e.g., integrating the feedthrough within the driver circuitry 138 only, using external power feedthroughs, using separate external feedthroughs for the driver circuitry 138 and the ESDP circuitry 140, etc.).

Figure 13:
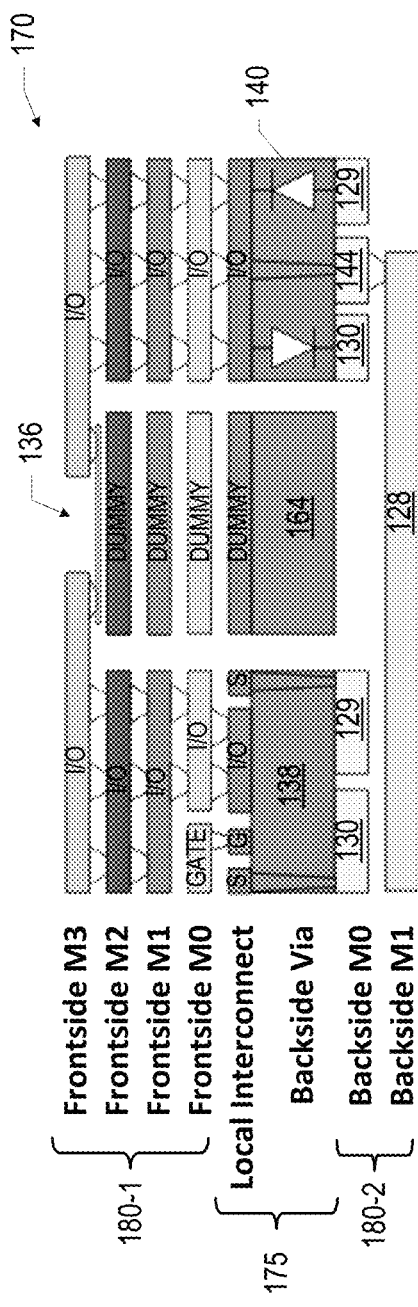
FIGS. 13-14 illustrate example IC structures implementing the I/O circuitry of FIG. 9 with a frontside series resistance, in accordance with various embodiments.
Figure 14:
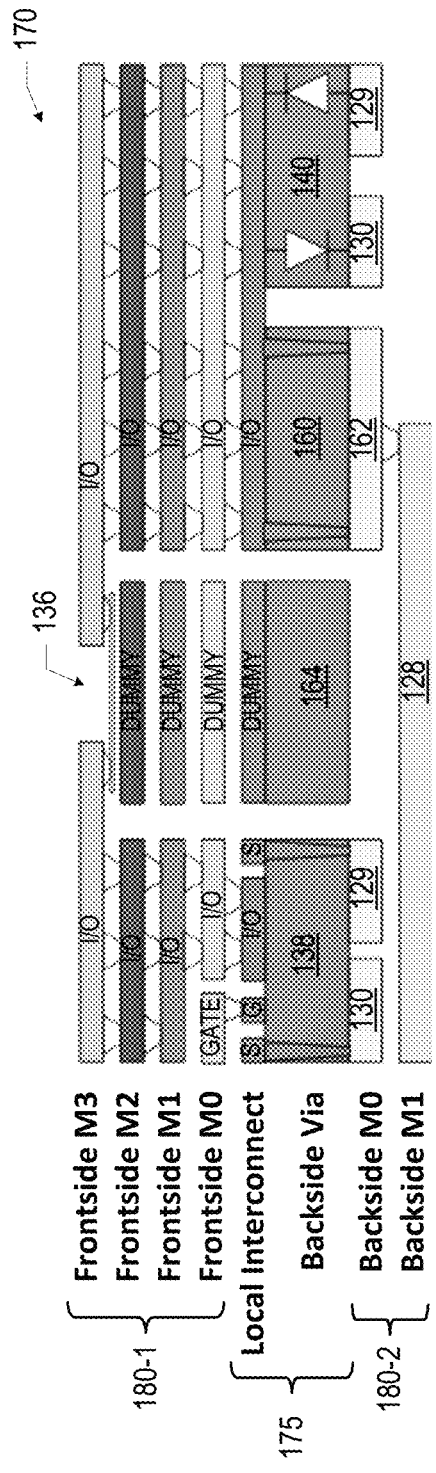

FIGS. 13-14 illustrate example IC structures 170 implementing the I/O circuitry 150 of FIG. 9 with a frontside series resistance 136 in accordance with various embodiments. In the embodiment of FIGS. 13 and 14, a frontside series resistance 136 (e.g., a thin film resistor (TFR), a metal resistor, or another resistive element) may be included in the frontside metallization stack 180-1; dummy regions 164 may be disposed below the series resistance 136. FIG. 13 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1 and through the series resistance 136. The I/O signal pathways through the frontside metallization stack 180-1, after the series resistance 136, may couple to the ESDP circuitry 140, which may include diodes (e.g., the diodes 132 discussed above with reference to FIG. 9, not labeled in FIG. 13) coupled to the positive power supply 129 and the negative power supply 130 (included in the backside metallization stack 180-2) using backside vias in an internal feedthrough arrangement (e.g., as discussed above with reference to FIGS. 5-6), as well as one or more backside vias in an internal feedthrough arrangement (e.g., as illustrated in FIGS. 1-2) to couple the I/O signal pathways to the I/O pad 128 via a backside I/O metallization 144 (also included in the backside metallization stack 180-2).

FIG. 14 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1 and through the series resistance 136. The I/O signal pathways through the frontside metallization stack 180-1, after the series resistance 136, may couple to the ESDP circuitry 140, which may include diodes (e.g., the diodes 132 discussed above with reference to FIG. 9, not labeled in FIG. 14) coupled to the positive power supply 129 and the negative power supply 130 (included in the backside metallization stack 180-2) using backside vias in an internal feedthrough arrangement (e.g., as discussed above with reference to FIGS. 5-6). The I/O signal pathways may couple the ESDP circuitry 140 to an external feedthrough structure 160 (e.g., as discussed above with reference to FIGS. 7-8) through conductive pathways in the frontside metallization stack 180-1. Backside vias in the external feedthrough structure 160 may couple the I/O signal pathways to the I/O pad 128 (also included in the backside metallization stack 180-2) via a backside I/O metallization 162. The embodiment of FIG. 14 may exhibit an increased branch-point resistance 134 relative to the embodiment of FIG. 13, but may also exhibit a reduced pad capacitance.

FIGS. 15-18 illustrate example IC structures 170 implementing the I/O circuitry 150 of FIG. 9 with a backside series resistance 136, in accordance with various embodiments. In the embodiment of FIGS. 15-18, a backside series resistance 136 (e.g., a TFR or another resistance) may be included in the backside metallization stack 180-2; external feedthrough structures 160 or a dummy region 164 may be disposed above the series resistance 136. FIG. 15 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1 and through the series resistance 136 (through backside vias in an external feedthrough structure 160). After the series resistance 136 (and through backside vias in the external feedthrough structure 160), I/O signal pathways through the frontside metallization stack 180-1 may couple to the ESDP circuitry 140. The ESDP circuitry 140 may include diodes (e.g., the diodes 132 discussed above with reference to FIG. 9, not labeled in FIG. 15) coupled to the positive power supply 129 and the negative power supply 130 (included in the backside metallization stack 180-2) using backside vias in an internal feedthrough arrangement (e.g., as discussed above with reference to FIGS. 5-6). The ESDP circuitry 140 may also include one or more backside vias in an internal feedthrough arrangement (e.g., as illustrated in FIGS. 1-2) to couple the I/O signal pathways to the I/O pad 128 via a backside I/O metallization 144 (also included in the backside metallization stack 180-2). The embodiment of FIG. 15 may utilize an integrated feedthrough in the ESDP circuitry 140 to achieve a low branch-point resistance 134, and may feedback down to the series resistance 136 locally and back up to the driver circuitry 138 following the series resistance 136.

FIG. 16 depicts an embodiment in which the driver circuitry 138 includes backside vias 110 to the positive power supply 129 and the negative power supply 130 (included in the backside metallization stack 180-2) using backside vias in an internal feedthrough arrangement, but is coupled to I/O signal pathways through the frontside metallization stack 180-1 and through backside vias and an external feedthrough structure 160 to the series resistance 136. After the series resistance 136 (and through backside vias and the external feedthrough structure 160), I/O signal pathways through the frontside metallization stack 180-1 may couple to the ESDP circuitry 140, which may include diodes (e.g., the diodes 132 discussed above with reference to FIG. 9, not labeled in FIG. 16) coupled to the positive power supply 129 and the negative power supply 130 (included in the backside metallization stack 180-2) using backside vias in an internal feedthrough arrangement (e.g., as discussed above with reference to FIGS. 5-6). The I/O signal pathways may couple between the ESDP circuitry 140 to an external feedthrough structure 160 (e.g., as discussed above with reference to FIGS. 7-8) through conductive pathways in the frontside metallization stack 180-1. Backside vias in the external feedthrough structure 160 may couple the I/O signal pathways to the I/O pad 128 (also included in the backside metallization stack 180-2) via a backside I/O metallization 162. The embodiment of FIG. 16 may pull the main feedthrough out of the ESDP circuitry 140 to reduce the pad capacitance relative to the embodiment of FIG. 15.

Figure 17:
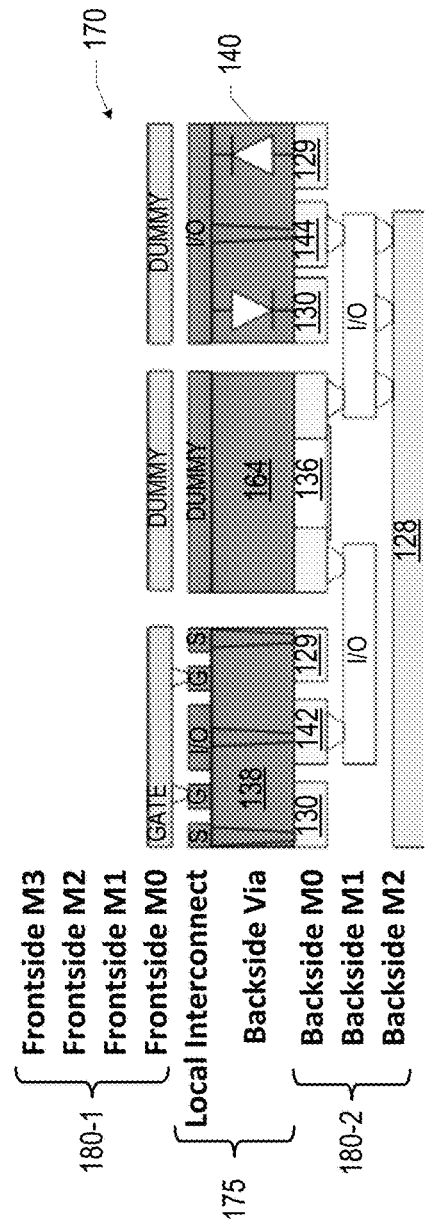

FIG. 17 depicts an embodiment in which the driver circuitry 138 includes backside vias 110 to the positive power supply 129 and the negative power supply 130 (included in the backside metallization stack 180-2) using backside vias in an internal feedthrough arrangement, and is also coupled to I/O pathways in the backside metallization stack 180-2 through one or more backside vias in an internal feedthrough arrangement (e.g., as illustrated in FIGS. 1-2) and via a backside I/O metallization 142. These backside I/O pathways may couple to the series resistance 136, and then through further backside I/O pathways to the I/O pad 128. The further backside I/O pathways may couple to the backside I/O metallization 144 of the ESDP circuitry 140. The ESDP circuitry 140, which may include diodes (e.g., the diodes 132 discussed above with reference to FIG. 9, not labeled in FIG. 17) coupled to the positive power supply 129 and the negative power supply 130 (included in the backside metallization stack 180-2) using backside vias in an internal feedthrough arrangement (e.g., as discussed above with reference to FIGS. 5-6), as well as one or more backside vias in an internal feedthrough arrangement (e.g., as illustrated in FIGS. 1-2) to couple to the I/O pad 128 via a backside I/O metallization 144 (also included in the backside metallization stack 180-2). The embodiment of FIG. 17 may include separate integrated feedthroughs in the driver circuitry 138 and the ESDP circuitry 140 to reach the frontside metallization stack 180-1, but routing is performed in the backside metallization stack 180-2. Such an embodiment it may have a high pad capacitance, but may free frontside routing resources.

Figure 18:
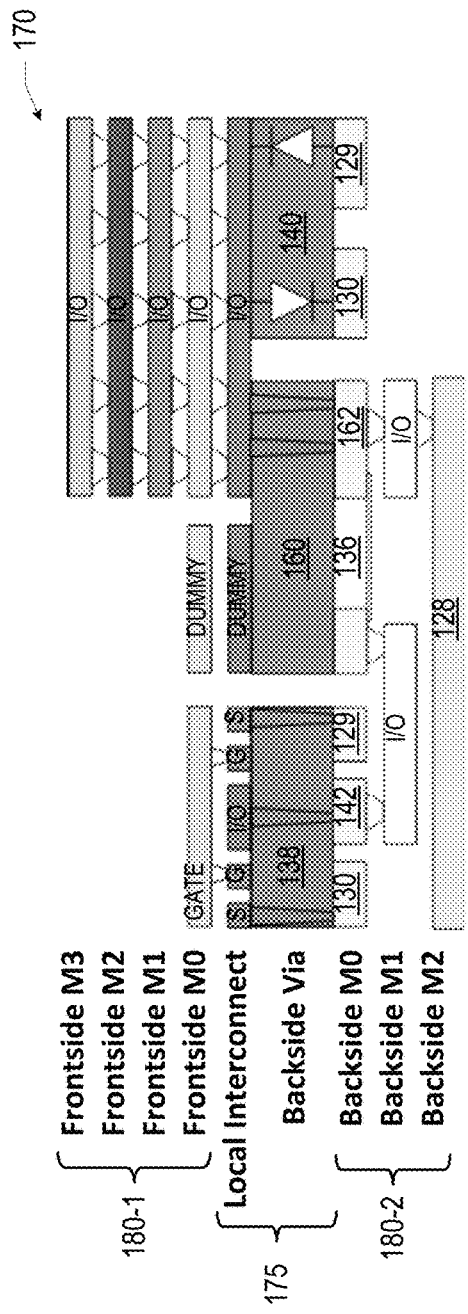

FIG. 18 depicts an embodiment in which the driver circuitry 138 includes backside vias 110 to the positive power supply 129 and the negative power supply 130 (included in the backside metallization stack 180-2) using backside vias in an internal feedthrough arrangement, and is also coupled to I/O pathways in the backside metallization stack 180-2 through one or more backside vias in an internal feedthrough arrangement (e.g., as illustrated in FIGS. 1-2) and via a backside I/O metallization 142. These backside I/O pathways may couple to the series resistance 136, and then through further backside I/O pathways to the I/O pad 128. The further backside I/O pathways may couple to the backside I/O metallization 162 of the external feedthrough structure 160, which may be coupled to I/O pathways in the frontside metallization stack 180-1. These frontside I/O pathways may couple to the ESDP circuitry 140, which may include diodes (e.g., the diodes 132 discussed above with reference to FIG. 9, not labeled in FIG. 17) coupled to the positive power supply 129 and the negative power supply 130 (included in the backside metallization stack 180-2) using backside vias in an internal feedthrough arrangement (e.g., as discussed above with reference to FIGS. 5-6). The embodiment of FIG. 18 utilizes an integrated feedthrough in the driver circuitry 138, but an external feedthrough in the ESDP circuitry 140. Such an embodiment may trade off use of some frontside routing resources for reduced pad capacitance relative to the embodiment of FIG. 17.

The IC structures 100 and 170 disclosed herein may be included in any suitable electronic component. FIGS. 19-23 illustrate various examples of apparatuses that may include any of the IC structures 100/170 disclosed herein.

Figure 19:
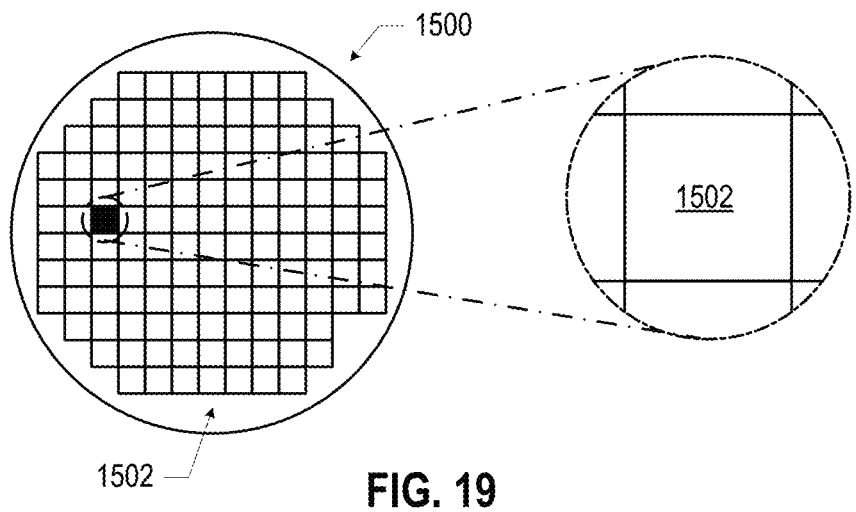
FIG. 19 is a top view of a wafer and dies that may include an IC structure including backside vias in accordance with any of the embodiments disclosed herein.
Figure 20:
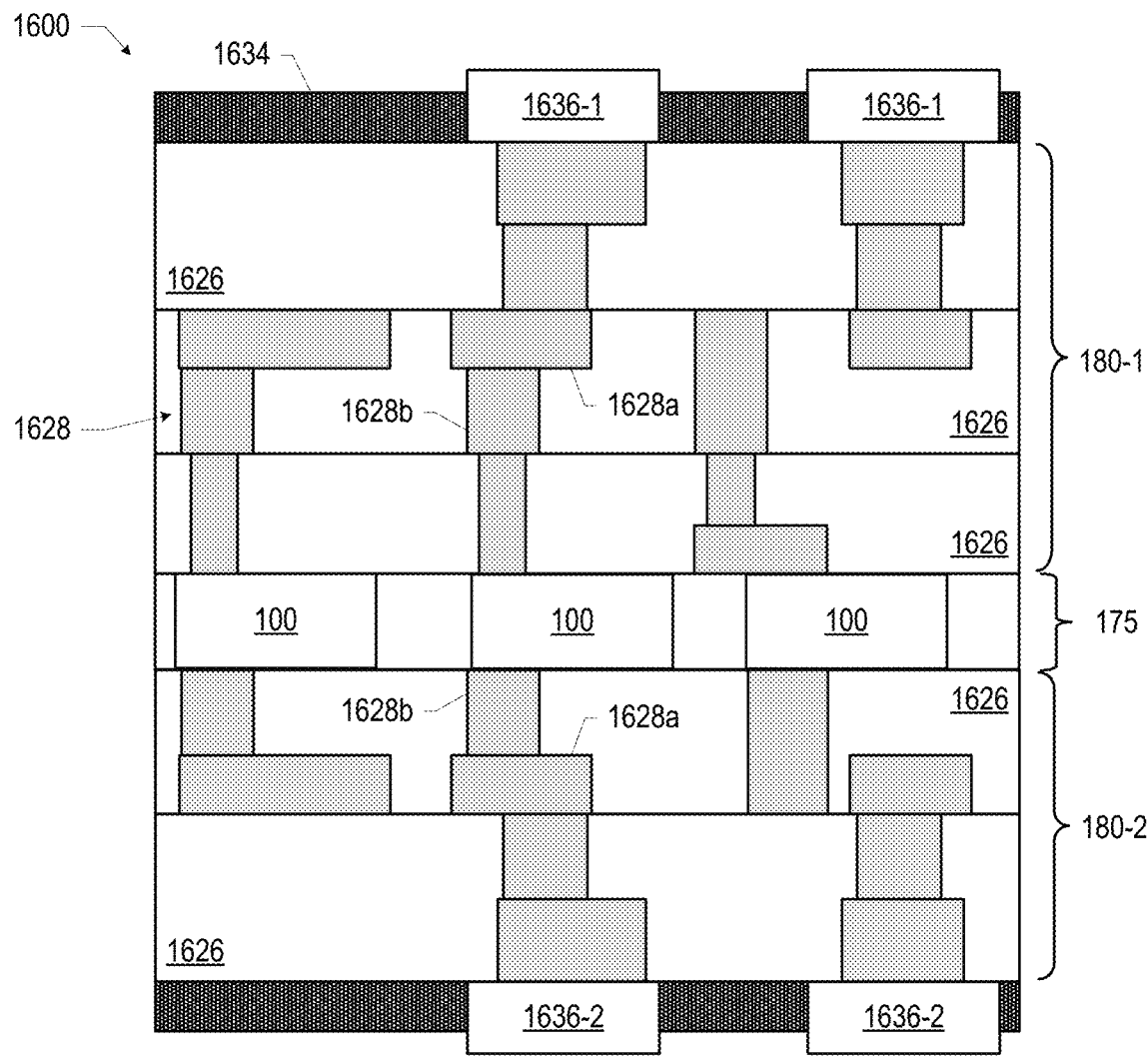
FIG. 20 is a side, cross-sectional view of an IC component that may include an IC structure including backside vias in accordance with any of the embodiments disclosed herein.

FIG. 19 is a top view of a wafer 1500 and dies 1502 that may include one or more IC structures 100/170 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100/170 (e.g., as discussed below with reference to FIG. 20), one or more transistors or diodes, supporting circuitry to route electrical signals to the transistors or diodes, as well as any other IC elements. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 23) or other logic that is configured to store information in the memory devices or execute instructions stored in the memory array.

FIG. 20 is a side, cross-sectional view of an IC component 1600 that may include one or more IC structures 100/170 in accordance with any of the embodiments disclosed herein. One or more of the IC components 1600 may be included in one or more dies 1502 (FIG. 19). The IC component 1600 may be formed on a substrate (e.g., the wafer 1500 of FIG. 19) and may be included in a die (e.g., the die 1502 of FIG. 19). The substrate may be a semiconductor substrate composed of semiconductor material systems including, for example, N-type or P-type materials systems (or a combination of both). The substrate may include, for example, a crystalline substrate formed using a bulk silicon or an SOI substructure. In some embodiments, the substrate may be formed using alternative materials, which may or may not be combined with silicon, that include but are not limited to germanium, indium antimonide, lead telluride, indium arsenide, indium phosphide, gallium arsenide, gallium nitride, or gallium antimonide. Further materials classified as group II-VI, III-V, or IV may also be used as the substrate. Although a few examples of materials from which the substrate may be formed are described here, any material that may serve as a foundation for an IC component 1600 may be used. The substrate may be part of a singulated die (e.g., the dies 1502 of FIG. 19) or a wafer (e.g., the wafer 1500 of FIG. 19).

The IC component 1600 may include one or more device layers 175 between a frontside metallization stack 180-1 and a backside metallization stack 180-2. The device layer 175 may include one or more backside vias 110 (not shown in FIG. 20); in particular, the device layer 175 may include any of the IC structures 100 disclosed herein, and the IC component 1600 may include any of the backside I/O IC structures 170 disclosed herein. As discussed above, the device layer 175 may include features of one or more transistors (e.g., metal oxide semiconductor field-effect transistors (MOSFETs)). The device layer 175 may include, for example, one or more source and/or drain (S/D) regions (e.g., including the P-type epi regions 112 or the N-type epi regions 114 discussed above), a gate (e.g., including the gate electrodes 118 discussed above) to control current flow in the transistors between the S/D regions, and one or more S/D contacts (e.g., including the local interconnects 116 discussed above) to route electrical signals to/from the S/D regions. The transistors may include additional features, such as device isolation regions, gate contacts, and the like. The transistors included in a device layer 175 may include a wide variety of types and configurations of transistors such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors. As discussed above, a device layer 175 may include diodes and dummy semiconductor bodies, as suitable.

As discussed above, power and/or I/O signals may be routed to and/or from the device layer 175 through a frontside metallization stack 180-1 above the device layer 175 and/or a backside metallization stack 180-2 below the device layer. For example, electrically conductive features of the device layer 175 (e.g., the gate and the S/D contacts of a transistor, electrically conductive features of a diode, an external feedthrough arrangement including a backside via 110, etc.) may be electrically coupled with the interconnect structures 1628 of the metallization stacks 180.

The interconnect structures 1628 may be arranged within the metallization stacks 180 to route electrical signals according to a wide variety of designs (in particular, the arrangement is not limited to the particular configuration of interconnect structures 1628 depicted in FIG. 20). Although a particular number of layers in the metallization stacks 180 is depicted in FIG. 20, embodiments of the present disclosure include IC components having more or fewer interconnect layers than depicted (e.g., in accordance with the embodiments of any of FIGS. 10-18).

In some embodiments, the interconnect structures 1628 may include lines 1628a and/or vias 1628b filled with an electrically conductive material such as a metal (e.g., copper, aluminum, tungsten, or another metal or combination of materials). The lines 1628a may be arranged to route electrical signals in a direction of a plane that is substantially parallel with a surface of the substrate upon which the device layer 175 is formed. For example, the lines 1628a may route electrical signals in a direction in and out of the page from the perspective of FIG. 20. The vias 1628b may be arranged to route electrical signals in a direction of a plane that is substantially perpendicular to the surface of the substrate upon which the device layer 175 is formed. In some embodiments, the vias 1628b may electrically couple lines 1628a of different layers together.

The metallization stacks 180 may include a dielectric material 1626 between the interconnect structures 1628, as shown in FIG. 20. In some embodiments, the dielectric material 1626 disposed between the interconnect structures 1628 in different ones of the layers of the metallization stacks 180, and/or in different ones of the metallization stacks 180, may have different compositions; in other embodiments, the composition of the dielectric material 1626 between different layers in the metallization stacks 180 may be the same. Although the lines 1628a and the vias 1628b are structurally delineated with a line within each layer of a metallization stack 180 for the sake of clarity, the lines 1628a and the vias 1628b may be structurally and/or materially contiguous (e.g., simultaneously filled during a dual-damascene process) in some embodiments. In some embodiments, the layers that are "higher up" in the metallization stack 180-1 of the IC component 1600 (i.e., farther away from the device layer 175) may be thicker; similarly, in some embodiments, the layers that are "lower down" in the metallization stack 180-2 of the IC component 1600 (i.e., farther away from the device layer 175) may be thicker.

The IC component 1600 may include a solder resist material 1634 (e.g., polyimide or similar material) and one or more conductive contacts 1636 formed at the surfaces of the metallization stacks 180. In FIG. 20, the conductive contacts 1636 are illustrated as taking the form of bond pads. The conductive contacts 1636 may be electrically coupled with the interconnect structures 1628 and configured to route power, ground, and/or I/O signals between the device layer 175 and external devices. For example, solder bonds may be formed on the one or more conductive contacts 1636 to mechanically and/or electrically couple a chip including the IC component 1600 with another component (e.g., a package substrate, an interposer, a circuit board, etc.). The IC component 1600 may include additional or alternate structures to route the electrical signals from the metallization stacks 180; for example, the conductive contacts 1636 may include other analogous features (e.g., posts) that route the electrical signals to external components.

Figure 21:
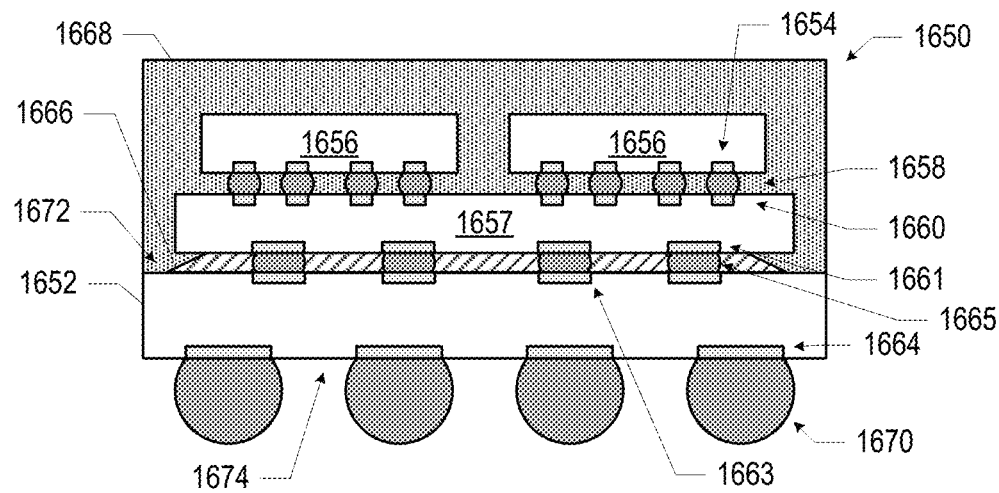
FIG. 21 is a side, cross-sectional view of an IC package that may include an IC structure including backside vias in accordance with any of the embodiments disclosed herein.

FIG. 21 is a side, cross-sectional view of an example IC package 1650 that may include one or more IC structures 100/170 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 20.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 21 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 21 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 21 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 22.

The dies 1656 may take the form of any of the embodiments of the die 1502 discussed herein (e.g., may include any of the embodiments of the IC component 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more IC structures 100/170 in accordance with any of the embodiments disclosed herein (e.g., as discussed above with reference to FIG. 19 and FIG. 20).

Although the IC package 1650 illustrated in FIG. 21 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 21, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 22:
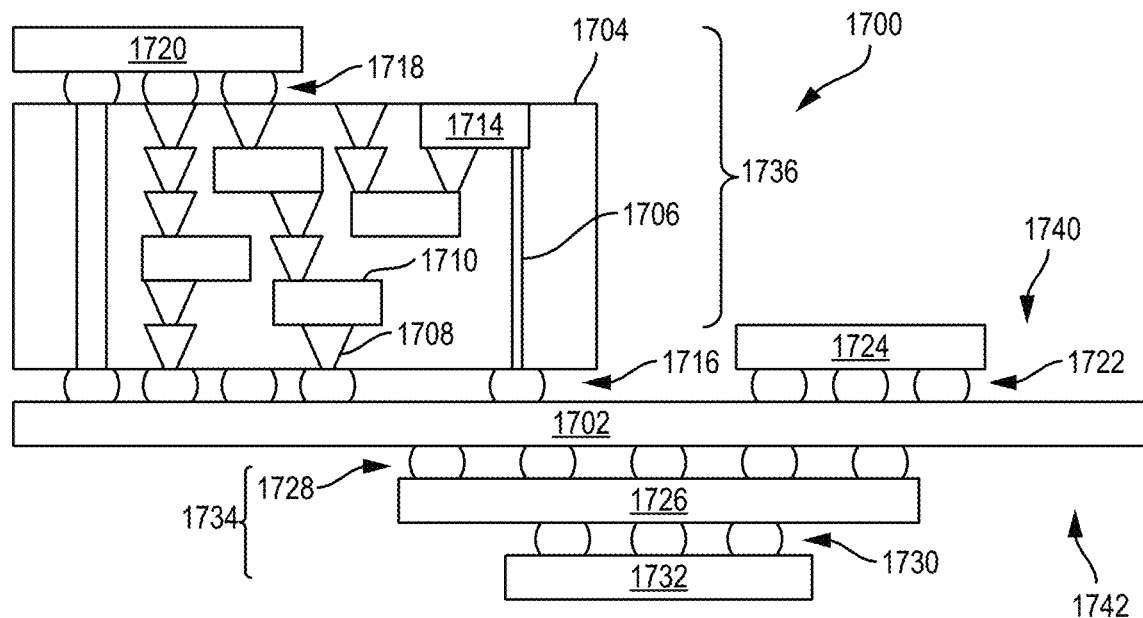
FIG. 22 is a side, cross-sectional view of an IC component assembly that may include an IC structure including backside vias in accordance with any of the embodiments disclosed herein.

FIG. 22 is a side, cross-sectional view of an IC component assembly 1700 that may include one or more IC packages or other electronic components (e.g., a die) including one or more IC structures 100/170 in accordance with any of the embodiments disclosed herein. The IC component assembly 1700 includes a number of components disposed on a circuit board 1702 (which may be, e.g., a motherboard). The IC component assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC component assembly 1700 may take the form of any of the embodiments of the IC package 1650 discussed above with reference to FIG. 21 (e.g., may include one or more IC structures 100/170 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC component assembly 1700 illustrated in FIG. 22 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 22), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 22, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 19), an IC component (e.g., the IC component 1600 of FIG. 20), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 22, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC component assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC component assembly 1700 illustrated in FIG. 22 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 23:
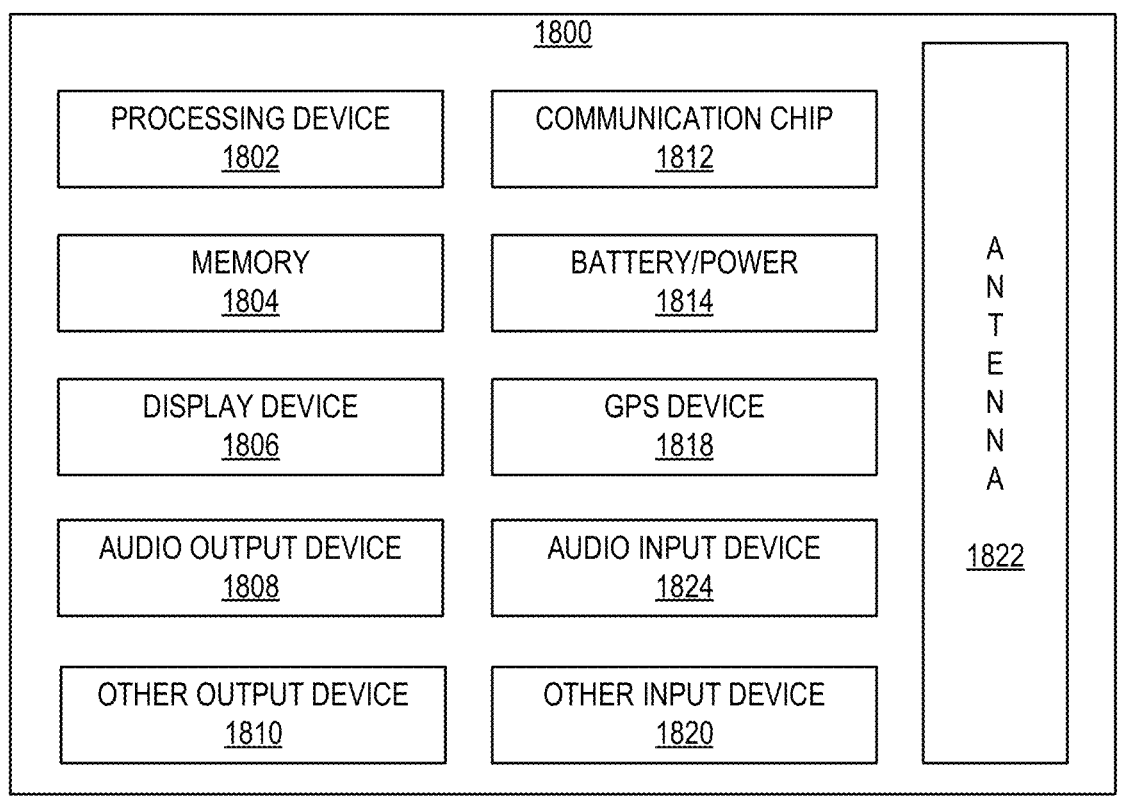
FIG. 23 is a block diagram of an example electrical device that may include an IC structure including backside vias in accordance with any of the embodiments disclosed herein.

FIG. 23 is a block diagram of an example electrical device 1800 that may include one or more IC structures 100/170 in accordance with any of the embodiments disclosed herein. For example, any suitable ones of the components of the electrical device 1800 may include one or more of the IC component assemblies 1700, IC packages 1650, IC components 1600, or dies 1502 disclosed herein. A number of components are illustrated in FIG. 23 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die. Electrical devices 1800 that may particularly benefit from the IC structures 100 and 170 disclosed herein may include high-performance computing devices, such as server products, high-speed computing cores, or other processing devices.

Additionally, in various embodiments, the electrical device 1800 may not include one or more of the components illustrated in FIG. 23, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a device layer, wherein the device layer includes a plurality of active devices; a first metallization layer over the device layer, wherein the first metallization layer includes a first conductive pathway in conductive contact with at least one of the active devices in the device layer; a second metallization layer under the device layer, wherein the second metallization layer includes a second conductive pathway; and a conductive via in the device layer, wherein the conductive via is in conductive contact with at least one of the active devices in the device layer and also in conductive contact with the second conductive pathway.

Example 2 includes the subject matter of Example 1, and further specifies that the device layer includes a semiconductor body, and the conductive via is spaced apart from and parallel to the semiconductor body.

Example 3 includes the subject matter of Example 2, and further specifies that the semiconductor body includes a semiconductor fin.

Example 4 includes the subject matter of any of Examples 2-3, and further includes:
a third conductive pathway, wherein the conductive via is electrically between the second conductive pathway and the third conductive pathway.

Example 5 includes the subject matter of Example 4 wherein the plurality of active devices includes a transistor, and the third conductive pathway is in contact with a source/drain (S/D) region of the transistor.

Example 6 includes the subject matter of any of Examples 4-5, and further specifies that the third conductive pathway is included in the device layer.

Example 7 includes the subject matter of Example 1, and further specifies that the device layer includes a semiconductor body, and the conductive via is in contact with the semiconductor body.

Example 8 includes the subject matter of Example 7, and further specifies that the semiconductor body includes a semiconductor fin.

Example 9 includes the subject matter of Example 8, and further specifies that the conductive via extends through multiple semiconductor bodies.

Example 10 includes the subject matter of any of Examples 8-9, and further specifies that the plurality of active devices includes a transistor, and the conductive via is in contact with a source/drain (S/D) region of the transistor.

Example 11 includes the subject matter of any of Examples 1-10, and further specifies that the device layer includes a first semiconductor region and a second semiconductor region, the second metallization layer includes a first conductive region under the first semiconductor region, the second metallization layer includes a second conductive region under the second semiconductor region, and an insulating material is between the first conductive region and the second conductive region.

Example 12 includes the subject matter of Example 11, and further specifies that the first conductive region is a supply voltage region and the second conductive region is a gated supply voltage region.

Example 13 includes the subject matter of any of Examples 11-12, and further specifies that the first conductive region contacts the first semiconductor region and the second conductive region contacts the second semiconductor region.

Example 14 includes the subject matter of any of Examples 11-13, and further specifies that the second metallization layer includes an insulating material between the first conductive region and the first semiconductor region, and the second metallization layer includes an insulating material between the second conductive region and the second semiconductor region.

Example 15 includes the subject matter of Example 14, and further specifies that the first semiconductor region and the second semiconductor region are N-type semiconductor regions, or the first semiconductor region and the second semiconductor region are P-type semiconductor regions.

Example 16 includes the subject matter of any of Examples 11-14, and further specifies that the first semiconductor region is an N-type semiconductor region and the second semiconductor region is a P-type semiconductor region.

Example 17 includes the subject matter of any of Examples 1-16, and further specifies that the second metallization layer includes a conductive pathway in contact with a semiconductor material of the device layer.

Example 18 includes the subject matter of any of Examples 1-17, and further specifies that the conductive via is a power delivery via.

Example 19 includes the subject matter of any of Examples 1-17, and further specifies that the conductive via is a signal via.

Example 20 includes the subject matter of any of Examples 1-19, and further specifies that the first metallization layer is a frontside metallization layer and the second metallization layer is a backside metallization layer.

Example 21 includes the subject matter of any of Examples 1-20, and further specifies that the device layer includes a semiconductor body, and the semiconductor body is wider closer to the second metallization layer and narrower closer to the first metallization layer.

Example 22 is an integrated circuit (IC) structure, including: a device layer, wherein the device layer includes an active device region and a dummy region; a first metallization layer over the device layer, wherein the first metallization layer includes a first conductive pathway in conductive contact with the active device region; a second metallization layer under the device layer, wherein the second metallization layer includes a second conductive pathway; and a conductive via in the device layer, wherein the conductive via is in the dummy region, the conductive via is in conductive contact with the first conductive pathway and with the second conductive pathway.

Example 23 includes the subject matter of Example 22, and further specifies that the dummy region includes a semiconductor body, and the conductive via is spaced apart from and parallel to the semiconductor body.

Example 24 includes the subject matter of Example 23, and further specifies that the semiconductor body includes a semiconductor fin.

Example 25 includes the subject matter of any of Examples 23-24, and further includes a third conductive pathway, wherein the conductive via is electrically between the second conductive pathway and the third conductive pathway.

Example 26 includes the subject matter of Example 25, and further specifies that the third conductive pathway is included in the device layer.

Example 27 includes the subject matter of Example 22, and further specifies that the dummy region includes a semiconductor body, and the conductive via is in contact with the semiconductor body.

Example 28 includes the subject matter of Example 27, and further specifies that the semiconductor body includes a semiconductor fin.

Example 29 includes the subject matter of Example 28, and further specifies that the conductive via extends through multiple semiconductor bodies in the dummy region.

Example 30 includes the subject matter of any of Examples 22-29, and further specifies that the active device region includes a transistor or a diode.

Example 31 includes the subject matter of any of Examples 22-30, and further specifies that the second metallization layer includes a conductive pathway in contact with a semiconductor material of the device layer.

Example 32 includes the subject matter of any of Examples 22-31, and further specifies that the conductive via is a power delivery via.

Example 33 includes the subject matter of any of Examples 22-32, and further specifies that the conductive via is a signal via.

Example 34 includes the subject matter of any of Examples 22-33, and further specifies that the first metallization layer is a frontside metallization layer and the second metallization layer is a backside metallization layer.

Example 35 includes the subject matter of any of Examples 22-34, and further specifies that the device layer includes a semiconductor body, and the semiconductor body is wider closer to the second metallization layer and narrower closer to the first metallization layer.

Example 36 is an integrated circuit (IC) structure, including: a device layer, wherein the device layer includes a circuitry region including a transistor region and a diode region; a first metallization layer over the device layer, wherein the first metallization layer includes a first conductive pathway in conductive contact with the circuitry region; a second metallization layer under the device layer, wherein the second metallization layer includes a second conductive pathway; and a conductive via in the device layer, wherein the conductive via is in conductive contact with the circuitry region and also in conductive contact with the second conductive pathway.

Example 37 includes the subject matter of Example 36, and further specifies that the conductive via is in the diode region.

Example 38 includes the subject matter of Example 37, and further specifies that the first conductive pathway is electrically between the transistor region and the diode region.

Example 39 includes the subject matter of any of Examples 37-38, and further includes: a resistor, wherein the resistor is electrically between the transistor region and the diode region.

Example 40 includes the subject matter of Example 39, and further specifies that the resistor includes a thin film resistor.

Example 41 includes the subject matter of any of Examples 39-40, and further specifies that the device layer is between the resistor and the second metallization layer.

Example 42 includes the subject matter of any of Examples 39-40, and further specifies that the device layer is between the resistor and the first metallization layer.

Example 43 includes the subject matter of any of Examples 37-42, and further specifies that the conductive via is a first conductive via, the IC structure includes a third conductive pathway in the second metallization layer, the IC structure further includes a second conductive via in the device layer, the second conductive via is in conductive contact with the circuitry region and also in conductive contact with the third conductive pathway.

Example 44 includes the subject matter of Example 43, and further specifies that the second conductive via is in the transistor region.

Example 45 includes the subject matter of Example 43, and further specifies that the circuitry region further includes a dummy region, and the second conductive via is in the dummy region.

Example 46 includes the subject matter of Example 36, and further specifies that the device layer includes a dummy region, and the conductive via is in the dummy region.

Example 47 includes the subject matter of Example 46, and further specifies that the first conductive pathway is electrically between the dummy region and the diode region, and another conductive pathway in the first metallization layer is electrically between the dummy region and the transistor region.

Example 48 includes the subject matter of any of Examples 46-47, and further includes: a resistor, wherein the resistor is electrically between the transistor region and the diode region.

Example 49 includes the subject matter of Example 48, and further specifies that the resistor includes a thin film resistor.

Example 50 includes the subject matter of any of Examples 48-49, and further specifies that the device layer is between the resistor and the second metallization layer.

Example 51 includes the subject matter of any of Examples 48-49, and further specifies that the device layer is between the resistor and the first metallization layer.

Example 52 includes the subject matter of any of Examples 46-51, and further specifies that the conductive via is a first conductive via, the IC structure includes a third conductive pathway in the second metallization layer, the IC structure further includes a second conductive via in the device layer, the second conductive via is in conductive contact with the circuitry region and also in conductive contact with the third conductive pathway.

Example 53 includes the subject matter of Example 52, and further specifies that the second conductive via is in the transistor region.

Example 54 includes the subject matter of any of Examples 36-53, and further specifies that the device layer includes a semiconductor body, and the conductive via is spaced apart from and parallel to the semiconductor body.

Example 55 includes the subject matter of Example 54, and further specifies that the semiconductor body includes a semiconductor fin.

Example 56 includes the subject matter of any of Examples 54-55, and further includes:
a third conductive pathway, wherein the conductive via is electrically between the second conductive pathway and the third conductive pathway.

Example 57 includes the subject matter of Example 56, and further specifies that the third conductive pathway is included in the device layer.

Example 58 includes the subject matter of any of Examples 36-57, and further specifies that the device layer includes a semiconductor body, and the conductive via is in contact with the semiconductor body.

Example 59 includes the subject matter of Example 58, and further specifies that the semiconductor body includes a semiconductor fin.

Example 60 includes the subject matter of Example 59, and further specifies that the conductive via extends through multiple semiconductor bodies.

Example 61 includes the subject matter of any of Examples 36-60, and further specifies that the second metallization layer includes a conductive pathway in contact with a semiconductor material of the device layer.

Example 62 includes the subject matter of any of Examples 36-61, and further specifies that the first metallization layer is a frontside metallization layer and the second metallization layer is a backside metallization layer.

Example 63 includes the subject matter of any of Examples 36-62, and further specifies that the device layer includes a semiconductor body, and the semiconductor body is wider closer to the second metallization layer and narrower closer to the first metallization layer.

Example 64 includes the subject matter of any of Examples 36-63, and further includes: additional conductive vias in the device layer, wherein some of the additional conductive vias are in the transistor region and electrically couple the transistor region to one or more voltage supply rails, and some of the additional conductive vias are in the diode region and electrically couple the diode region to one or more voltage supply rails.

Example 65 includes the subject matter of any of Examples 36-64, and further specifies that the circuitry region is an input/output (I/O) circuitry region.

Example 66 includes the subject matter of any of Examples 36-65, and further specifies that the transistor region is an input/output (I/O) driver region.

Example 67 includes the subject matter of any of Examples 36-66, and further specifies that the diode region is an electrostatic discharge protection (ESDP) region.

Example 68 is a computing device including the IC structure of any of Examples 1-67.

Example 69 includes the subject matter of Example 68, and further specifies that the computing device is a handheld computing device.

Example 70 includes the subject matter of Example 68, and further specifies that the computing device is a server computing device.

Example 71 includes the subject matter of Example 68, and further specifies that the computing device is a wearable computing device.

Example 72 includes the subject matter of any of Examples 68-71, and further includes an antenna or a display device.

Example 73 includes the subject matter of any of Examples 68-72, and further specifies that the IC structure is included in a die, and the die is coupled to a package substrate.

The invention claimed is:

1. An integrated circuit (IC) structure, comprising:
a device layer;
a first metallization layer over the device layer;
a second metallization layer under the device layer; and
a conductive via through the device layer, wherein:
the device layer includes:
a first fin having a first semiconductor material;
a second fin having a second semiconductor material, the second semiconductor material being different from the first semiconductor material; and
a first portion of an insulator separating the first fin and the second fin,
the first metallization layer includes a first conductive pathway in conductive contact with at least one of the first fin and the second fin,
the second metallization layer includes:
a second conductive pathway in direct contact with at least one of the first fin and the second fin; and
a second portion of the insulator coplanar with the second conductive pathway, and
the conductive via is in conductive contact with the first conductive pathway and the second conductive pathway.

2. The IC structure of claim 1, wherein electrical signals are passed through the conductive via in the device layer.

3. The IC structure of claim 1, wherein the first semiconductor material comprises an N-type semiconductor material, and the second semiconductor material comprises a P-type semiconductor material.

4. The IC structure of claim 1, wherein:
the first fin further comprises an epitaxial region having the second semiconductor material, and
the second fin further comprises another epitaxial region having the first semiconductor material.

5. The IC structure of claim 1, wherein:
the first fin further comprises a gate electrode, and
the second fin further comprises another gate electrode.

6. The IC structure of claim 5, wherein the gate electrode and the another gate electrode are in electrical contact with the first conductive pathway.

7. A fin-based IC structure, comprising:
a first fin including an N-type body region, over which are two P-type epitaxial regions and a first gate electrode between the two P-type epitaxial regions;
a second fin including a P-type body region over which are two N-type epitaxial regions and a second gate electrode between the two N-type epitaxial regions;
a first interconnect over the first fin and the second fin electrically coupled to at least one of a frontside metallization stack, the first electrode, and the second electrode;
a second interconnect under the first fin and the second fin electrically coupled to a backside metallization stack and in direct contact with at least one of the first fin and the second fin; and
a backside conductive via in contact with the first interconnect and the second interconnect; and
an insulating material comprising a first portion between the first fin and the second fin, and a second portion coplanar with the second interconnect.

8. The fin-based IC structure of claim 7, further comprising a pair of sidewall spacers on opposing sides the first gate electrode and the second gate electrode.

9. The fin-based IC structure of claim 7, wherein:
the fin-based structure functions as a transistor, and
the two P-type epitaxial regions and the two N-type epitaxial regions function as source/drain regions in the transistor.

10. The fin-based IC structure of claim 7, wherein the first fin and the second fin are aligned parallel to each other with an insulator between the first fin and the second fin.

11. The fin-based IC structure of claim 9, wherein the backside conductive via is parallel to the first fin and the second fin.

12. The fin-based IC structure of claim 9, wherein the backside conductive via is perpendicular to the first fin and the second fin.

13. The fin-based IC structure of claim 12, wherein the backside conductive via contacts at least one of the P-type epitaxial regions and the N-type epitaxial regions.

14. The fin-based IC structure of claim 7, wherein:
the N-type body region is over a power supply rail,
the P-type body region is over a gated power output rail, and
the power supply rail and the gated power output rail are part of the backside metallization stack.

15. The fin-based IC structure of claim 14, wherein the P-type body region is electrically shorted to the gated power output rail.

16. The fin-based IC structure of claim 7, wherein the first fin and the second fin are electrically isolated and function as dummy regions in an IC.

* * * * *